United States Patent
Morikawa

(10) Patent No.: US 6,822,504 B2
(45) Date of Patent: Nov. 23, 2004

(54) CORRECTION CIRCUIT FOR GENERATING A CONTROL SIGNAL FOR CORRECTING A CHARACTERISTIC CHANGE OF A TRANSISTOR, A DELAY CIRCUIT USING THE SAME, AND A RING OSCILLATOR CIRCUIT USING THE SAME

(75) Inventor: Yoshinao Morikawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/446,076

(22) Filed: May 28, 2003

(65) Prior Publication Data

US 2003/0222692 A1 Dec. 4, 2003

(30) Foreign Application Priority Data

May 28, 2002 (JP) ........................................ 2002-154769

(51) Int. Cl.[7] .............................................. H01L 35/00
(52) U.S. Cl. ........................ 327/513; 327/262; 326/32
(58) Field of Search ................................ 327/261, 262, 327/264, 277, 284, 285, 362, 512, 513; 326/31–34, 26, 27

(56) References Cited

U.S. PATENT DOCUMENTS

| | | | | |
|---|---|---|---|---|
| 4,473,762 A | * | 9/1984 | Iwahashi et al. | ............ 327/262 |
| 4,806,804 A | * | 2/1989 | O'Leary | ...................... 327/277 |
| 4,894,561 A | * | 1/1990 | Nogami | ........................ 326/27 |
| 4,975,598 A | * | 12/1990 | Borkar | ......................... 326/32 |
| 5,072,197 A | | 12/1991 | Anderson | ..................... 331/57 |
| 5,453,709 A | * | 9/1995 | Tanimoto et al. | ............ 327/276 |
| 5,907,255 A | * | 5/1999 | Churchill | .................... 327/262 |

FOREIGN PATENT DOCUMENTS

JP            7-38394 A       2/1995

* cited by examiner

*Primary Examiner*—Minh Nguyen
(74) *Attorney, Agent, or Firm*—Birch, Stewart, Kolasch & Birch, LLP

(57) ABSTRACT

A correction circuit for generating a control signal for correcting a characteristic change of a first transistor includes a control signal adjusting section including a constant voltage reduction element for determining either one of a maximum voltage and a minimum voltage of the control signal and a second transistor for determining a characteristic of the control signal, a gate electrode of the second transistor receiving a prescribed voltage; and a resistor section including two types of resistor elements having resistance values of different temperature dependency characteristics from each other, the resistor elements being connected in series. The constant voltage reduction element, the second transistor, and the resistor section are connected in series between a supply terminal and a ground terminal. The control signal is output from a connection point between the control signal adjusting section and the resistor section.

20 Claims, 16 Drawing Sheets

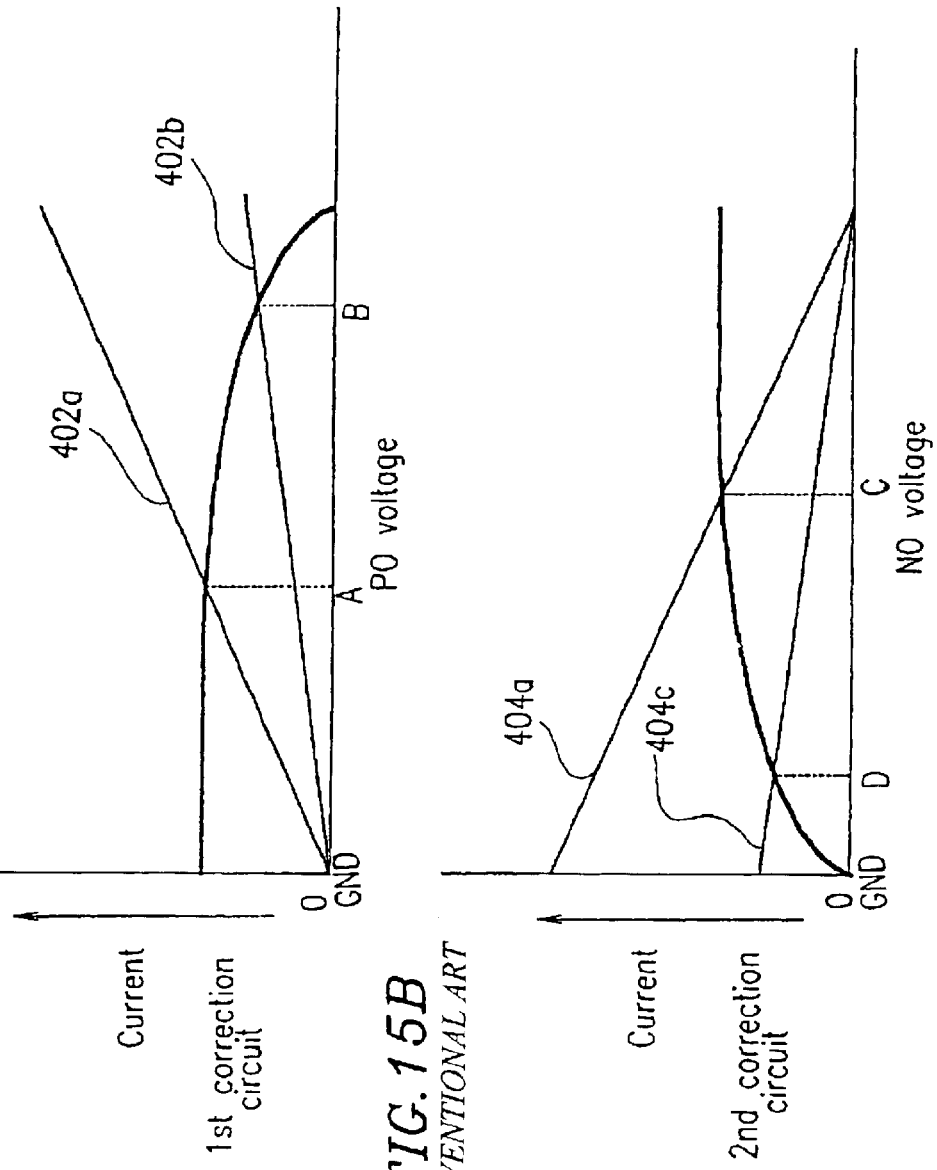

CORRECTION CIRCUIT FOR GENERATING A CONTROL SIGNAL FOR CORRECTING A CHARACTERISTIC CHANGE OF A TRANSISTOR, A DELAY CIRCUIT USING THE SAME, AND A RING OSCILLATOR CIRCUIT USING THE SAME

BACKGROUND OF THE INVENTION

1. Field of the Invention

The present invention relates to a correction circuit for generating a control signal for correcting a characteristic change caused by production conditions or physical conditions such as power supply and temperature in a transistor included in a semiconductor integrated circuit; and a delay circuit and a ring oscillator circuit including such a correction circuit. In particular, the present invention relates to a correction circuit, a delay circuit and a ring oscillator circuit which can be preferably used for, for example, generating a reference clock generation circuit (timing generation circuit) in, for example, an internal synchronization semiconductor memory device.

2. Description of the Related Art

Some delay circuits used as a timing generation circuit or the like in a CMOS semiconductor integrated circuit use a CMOS transistor. A delay circuit using a CMOS transistor uses signal transmission delay characteristics of the transistor which are determined by, for example, the driving load, the ON resistance, and the driving current of the transistor.

FIG. 6 shows a conventional delay circuit 100 using signal transmission delay characteristics of a transistor.

The delay circuit 100 includes a plurality of inverter circuits 103 connected to each other in series. In each inverter circuit 103, a p-channel (hereinafter, referred to as "Pch") transistor 101 and an n-channel (hereinafter, referred to as "Nch") transistor 102 are complementarily connected to each other as a pair between a supply terminal (supply voltage) and a ground terminal (ground voltage: earth). A gate of the Pch transistor 101 and a gate of the Nch transistor 102 included in each inverter circuit 103 each receive a signal from an input terminal or a signal from the previous-stage inverter circuit 103. A connection point between the Pch transistor 101 and the Nch transistor 102 outputs a signal to the subsequent-stage inverter circuit 103 or an output terminal.

When, for example, a signal from the input terminal or the previous-stage inverter circuit 103 is at an H level (supply voltage level), the Pch transistor 101 is turned OFF (non-conductive state) and the Nch transistor 102 is turned ON (conductive state). Therefore, the connection point between the Pch transistor 101 and the Nch transistor 102 outputs a signal at an L level (ground voltage level) to the subsequent-stage inverter circuit 103 or the output terminal. When a signal from the input terminal or the previous-stage inverter circuit 103 is at an L level, the Pch transistor 101 is turned ON and the Nch transistor 102 is turned OFF. Therefore, the connection point between the Pch transistor 101 and the Nch transistor 102 outputs a signal at an H level to the subsequent-stage inverter circuit 103 or the output terminal.

A delay time in the delay circuit 100 having the above-described structure will be described. A delay time is defined in a delay circuit as a time period from when an input signal voltage reaches the prescribed voltage until an output signal voltage reaches a prescribed voltage.

FIG. 7 is a timing diagram illustrating the timing of an input signal voltage and an output signal voltage in the delay circuit 100. In FIG. 7, the supply voltage is labeled as "VCC", and the ground voltage is labeled as "GND". Here, the delay time is a time period in the delay circuit 100 from when the input signal voltage becomes ½ VCC until when the output signal voltage becomes ½ VCC.

The delay time in the delay circuit 100 greatly changes in accordance with the characteristics of the transistors (driving current, threshold level, etc.) included in the delay circuit. In general, the transistor characteristics are dispersed by, for example, supply voltage used for the delay circuit, ambient temperature of the delay circuit, and the production parameters of the delay circuit such as gate thickness, gate width, gate length and the like.

Thus, in the delay circuit 100 including the inverter circuit 103 shown in FIG. 6 having a simple structure, the delay time shown in FIG. 7 is dispersed by the supply voltage, ambient temperature, production parameters, and the like. A change in delay time caused by the dispersion does not necessarily have favorable results on the other circuits included in the semiconductor integrated circuit. For example, when a set delay time is set under certain conditions, the delay time may be too long or too short under other conditions.

Japanese Laid-Open Publication No. 7-38394 proposes a circuit for controlling the delay time.

FIG. 8 shows a conventional delay circuit 200 including a first correction circuit 210 and a second correction circuit 220 for controlling the delay time.

The delay circuit 200 includes a plurality of inverter circuits 205a and a plurality of inverter circuits 205b alternately connected in series. In the example of FIG. 8, a total of four inverter circuits (two inverter circuits 205a and two inverter circuits 205b) are provided. Each inverter circuit 205a includes a logic inversion circuit 203 which includes a Pch transistor 201 and an Nch transistor 202 complementarily connected as a pair, and a Pch transistor 204a connected in series between the logic inversion circuit 203 and the supply terminal. Each inverter circuit 205b includes a logic inversion circuit 203 which includes a Pch transistor 201 and an Nch transistor 202 complementarily connected as a pair, and an Nch transistor 204b connected in series between the logic inversion circuit 203 and the ground terminal.

A gate of the Pch transistor 201 and a gate of the Nch transistor 202 included in each logic inversion circuit 203 each receive a signal from an input terminal or a signal from the previous-stage logic inversion circuit 203. A connection point between the Pch transistor 201 and the Nch transistor 202 outputs a signal to the subsequent-stage logic inversion circuit 203 or an output terminal.

A gate electrode of the Pch transistor 204a included in the inverter circuit 205a receives a voltage (control signal) generated in the first correction circuit 210. A gate electrode of the Nch transistor 204b included in the inverter circuit 205b receives a voltage (control signal) generated in the second correction circuit 220.

In the delay circuit 200, the driving capability of each transistor or the like is adjusted such that the delay time is dominantly controlled by the Pch transistor 204a and the Nch transistor 204b. Thus, the delay time can be controlled in accordance with the characteristics of output voltages (control signals) of the first correction circuit 210 and the second correction circuit 220. As a result, the delay time caused by the delay circuit 200 can be substantially the same regardless of the conditions.

FIG. 9A is an equivalent circuit of an operation of the first correction circuit 210 shown in Japanese Laid-Open Publication No. 7-38394, and FIG. 9B is an equivalent circuit of an operation of the second correction circuit 220 also shown in Japanese Laid-Open Publication No. 7-38394.

The first correction circuit 210 includes a Pch transistor 301 and a resistor 302 connected in series in this order between the supply terminal and the ground terminal. A gate electrode of the Pch transistor 301 is connected to the ground voltage. A connection point (PO node) between the Pch transistor 301 and the resistor 302 outputs a voltage (control signal) PO. The second correction circuit 220 includes a resistor 304 and an Nch transistor 303 connected in series in this order between the supply terminal and the ground terminal. A connection point (NO node) between the resistor 304 and the Nch transistor 303 outputs a voltage (control signal) NO.

An operation of the first correction circuit 210 and the second correction circuit 220 having the above-described structure will be described. Output voltages of the first correction circuit 210 and the second correction circuit 220 are determined by the current-voltage characteristic of the transistor and the current-voltage characteristic of the resistor.

FIG. 10A is a graph illustrating the current-voltage characteristics of the elements themselves included in the first correction circuit 210 (transistor and resistor). FIG. 10B is a graph illustrating the current-voltage characteristics of the elements themselves included in the second correction circuit 220 (transistor and resistor).

In FIG. 10A, a characteristic 401 represents the current-voltage characteristic of the Pch transistor 301 included in the first correction circuit 210. The horizontal axis represents the PO output voltage at a certain gate voltage. When the PO output voltage is at the GND level, the voltage difference between the source electrode and the drain electrode is VCC−GND. When the PO output voltage is at the VCC level, the voltage difference between the source electrode and the drain electrode is 0. The vertical axis represents the current flowing between the source electrode and the drain electrode. A characteristic 402 represents the current-voltage characteristic of the resistor 302 included in the first correction circuit 210. The horizontal axis represents the PO output voltage. When the PO output voltage is at the GND level, the voltage difference at both ends of the resistor 302 is 0. When the PO output voltage is at the VCC level, the voltage difference between both ends of the resistor 302 is VCC−GND. The vertical axis represents the current flowing through the resistor 302.

In FIG. 10B, a characteristic 403 represents the current-voltage characteristic of the Nch transistor 303 included in the second correction circuit 220. The horizontal axis represents the NO voltage at a certain gate voltage. When the NO voltage is at the GND level, the voltage difference between the source electrode and the drain electrode is 0. When the NO voltage is at the VCC level, the voltage difference between the source electrode and the drain electrode is VCC−GND. The vertical axis represents the current flowing between the source electrode and the drain electrode. A characteristics 404 represents the current-voltage characteristic of the resistor 304 included in the second correction circuit 220. The horizontal axis represents the NO voltage. When the NO voltage is at the GND level, the voltage difference at both ends of the resistor 304 is VCC−GND. When the NO voltage is at the VCC level, the voltage difference between both ends of the resistor 304 is 0. The vertical axis represents the current flowing through the resistor 304.

In each of the first correction circuit 210 and the second correction circuit 220, the transistor and the resistor are connected in series. Therefore, the intersection a of the characteristic 401 and the characteristic 402 shown in FIG. 10A represents the output voltage and the output current from the first correction circuit 210. The intersection b of the characteristic 403 and the characteristic 404 shown in FIG. 10B represents the output voltage and the output current from the second correction circuit 220.

The principle of controlling the delay circuit time in the delay circuit 200 will be described. In the following description, an "increase" (or a "decrease") of the capability of the transistor refers to an increase (or a decrease) of the current flowing between the source electrode and the drain electrode of the transistor.

The voltage output from the PO node (PO output voltage) in the first correction circuit 210 shown in FIG. 9A is sent as a control signal to the Pch transistor 204a shown in FIG. 8. The voltage output from the NO node (NO output voltage) in the second correction circuit 220 shown in FIG. 9B is sent as a control signal to the Nch transistor 204b shown in FIG. 8.

When, for example, the voltage of the PO node in FIG. 9A increases, the ON resistance of the Pch transistor 204a increases, since the output voltage therefrom (PO output voltage) is sent as a control signal to the gate electrode of the Pch transistor 204a shown in FIG. 8. As a result, the capability of the Pch transistor 204a decreases, and thus the delay time is extended. Conversely, when the voltage of the PO node in FIG. 9A decreases, the ON resistance of the Pch transistor 204a in FIG. 8 decreases. As a result, the capability of the Pch transistor 204a increases, and thus the delay time is shortened.

When, by contrast, the voltage of the NO node in FIG. 9B decreases, the ON resistance of the Nch transistor 204b increases, since the output voltage therefrom (NO output voltage) is sent as a control signal to the gate electrode of the Nch transistor 204b shown in FIG. 8. As a result, the capability of the Nch transistor 204b decreases, and thus the delay time is extended. Conversely, when the voltage of the NO node in FIG. 9B increases, the ON resistance of the Nch transistor 204b in FIG. 8 decreases. As a result, the capability of the Nch transistor 204b increases, and thus the delay time is shortened.

In the delay circuit 200 shown in FIG. 8, the delay time is extended when the capability of the Pch transistor 204a (FIG. 8) or the Nch transistor 204b decreases, and the delay time is shortened when the capability of the Pch transistor 204a or the Nch transistor 204b increases.

In consideration of the above, the relationship between the dispersion in ambient temperature and the delay time will be discussed. In general, when the ambient temperature of a circuit decreases, the threshold voltage of the transistor included in the circuit increases, but the capability of the transistor increases due to the semiconductor characteristics of the source electrode, the drain electrode, the channel region and the like. Accordingly, the delay time caused by the delay circuit 200 is shortened with the voltage of the NO node or the PO node being the same.

An operation of the delay circuit 200 will be discussed when the ambient temperature of the first correction circuit 210 and the second correction circuit 220 shown in FIGS. 9A and 9B decreases.

FIG. 11A is a graph illustrating a change in the current-voltage characteristics when the ambient temperature of the first correction circuit 210 decreases. As shown in FIG. 11A, when the ambient temperature of the first correction circuit 210 decreases, the capability of the Pch transistor 301 (FIG. 9A) increases. As a result, a current-voltage characteristic 401a of the transistor is changed into a current-voltage characteristic 401b, and thus the PO output voltage increases from voltage A to voltage B. In this manner, the voltage (control signal) from the PO node (FIG. 9A) increases.

FIG. 11B is a graph illustrating a change in the current-voltage characteristics when the ambient temperature of the second correction circuit 220 decreases. As shown in FIG. 11B, when the ambient temperature of the second correction circuit 220 decreases, the capability of the Nch transistor 303 (FIG. 9B) increases. As a result, a current-voltage characteristic 403a of the transistor is changed into a current-voltage characteristic 403b, and thus the NO output voltage decreases from voltage C to voltage D. In this manner, the voltage (control signal) from the NO node (FIG. 9B) decreases.

The PO output voltage (FIG. 9A) and the NO output voltage (FIG. 9B) are respectively input to the gate electrode of the Pch transistor 204a (FIG. 8) and the gate electrode of the Nch transistor 204b. Therefore, the ON resistance of each of the Pch transistor 204a and the Nch transistor 204b increases, and thus the capability of each of the Pch transistor 204a and the Nch transistor 204b decreases. As such, the decrease of the ambient temperature of the correction circuits acts on the delay circuit 200 so as to extend the delay time.

As described above, the decrease in the ambient temperature of the delay circuit 200 shortens the delay time with the voltage of the PO node and the voltage of the NO node (FIG. 8) being the same. However, the PO output voltage (FIG. 9A) and the NO output voltage (FIG. 9B) change so as to extend the delay time. Therefore, the action of shortening the delay time and the action of extending the delay time counteract each other, which allows the delay time to be kept the same.

FIG. 12A is a graph illustrating the relationship between the output voltage and the temperature (temperature-dependent characteristic of the output voltage) of the first correction circuit 210 (FIG. 9A). FIG. 12B is a graph illustrating the relationship between the output voltage and the temperature of the second correction circuit 220 (FIG. 9B). In the case where the first correction circuit 210 and the second correction circuit 220 provide the output voltage having the temperature-dependent characteristics shown in FIGS. 12A and 12B, the delay time can be controlled with respect to the varying temperature in the delay circuit 200 (FIG. 8).

The dispersion in production parameters occurring during the production of the semiconductor integrated circuit is handled in substantially the same manner. More specifically, when a characteristic is dispersed in the direction of decreasing the capability of the Pch transistor 204a and the Nch transistor 204b (FIG. 8), the output voltages (the PO output voltage and the NO output voltage) of the first correction circuit 210 and the second correction circuit 220 are changed in the direction of correcting the delay time in the delay circuit 200. When a characteristic is dispersed only in the Nch transistor 204b (FIG. 8), only the NO voltage which is input to the gate electrode of the Nch transistor 204b in the second correction circuit 220 (FIG. 9B) is changed. When a characteristic is dispersed only in the Pch transistor 204a (FIG. 8), only the PO voltage which is input to the gate electrode of the Pch transistor 204a in the first correction circuit 210 (FIG. 9A) is changed.

Next, an operation in the case where the supply voltage to the delay circuit 200 is changed will be discussed.

FIG. 13A is a graph illustrating a change in the current-voltage characteristic obtained when the supply voltage to the first correction circuit 210 is changed. As shown in FIG. 13A, when the supply voltage to the first correction circuit 210 is changed from voltage 1 to voltage 2, the voltage difference between the gate electrode and the source electrode of the Pch transistor 301 (FIG. 9A) included in the first correction circuit 210 is enlarged. As a result, the current-voltage characteristic 401a of the Pch transistor 301 is changed into a current-voltage characteristic 401c, and thus the PO output voltage is increased from voltage A to voltage B. In this manner, the voltage (control signal) from the PO node (FIG. 9A) increases.

FIG. 13B is a graph illustrating a change in the current-voltage characteristic obtained when the supply voltage to the second correction circuit 220 is changed. As shown in FIG. 13B, when the supply voltage to the second correction circuit 220 is changed from voltage 1 to voltage 2, the voltage difference between both ends of the resistor 304 included in the second correction circuit 220 (FIG. 9B) is enlarged. As a result, a current-voltage characteristic 404a of the resistor 304 is changed into a current-voltage characteristic 404b. The current-voltage characteristic 403a of the Nch transistor 303 is changed into a current-voltage characteristic 403c. As a result, the voltage (control signal) from the NO node shown in FIG. 9B is allowed to be not dependent on the supply voltage. For example, the NO output voltage is allowed to be constant at level C regardless of the supply voltage.

FIG. 14A is a graph illustrating the relationship between the output voltage and the supply voltage (supply voltage-dependent characteristic of the output voltage) of the first correction circuit 210 (FIG. 9A). FIG. 14B is a graph illustrating the relationship between the output voltage and the supply voltage of the second correction circuit 220 (FIG. 9B).

As described above, where the NO output voltage and the PO output voltage (FIG. 8) are constant, the delay time is shortened when the supply voltage to the delay circuit 200 increases. However, when the first correction circuit 210 and the second correction circuit 220 which provide output voltages having the supply voltage-dependent characteristics shown in FIGS. 14A and 14B are used, the PO output voltage and the NO output voltage act on the delay circuit 200 so as to extend the delay time. Therefore, the action of shortening the delay time and the action of extending the delay time counteract each other, which allows the delay time to be kept the same.

As described above, the conventional delay circuit 200 shown in FIG. 8 is provided with the first correction circuit 210 (FIG. 9A) and the second correction circuit 220 (FIG. 9B). Owing to such a structure, dispersion in delay time caused by the ambient temperature, supply voltage, production parameters of the semiconductor integrated circuit, and the like can be suppressed; or the dependency of the delay time on the ambient temperature, supply voltage, production parameters of the semiconductor integrated circuit, and the like can be freely controlled.

As described above, in the conventional delay circuit 200 including the first correction circuit 210 and the second correction circuit 220, dispersion in delay time can be suppressed, or the dependency of the delay time on the ambient temperature, supply voltage, production parameters, and the like can be freely controlled.

The resistance generated during the actual semiconductor process depends on temperature. For example, a diffusion resistance has a positive temperature dependency, and a polycrystalline silicon resistance has a negative temperature dependency. When the resistance has a positive temperature dependency, for example, when in FIG. 10, as the ambient temperature decreases, the resistance of the current-voltage characteristic decreases, the voltage from the PO node of the first correction circuit 210 (FIG. 9A) and the voltage from the NO node of the second correction circuit 220 (FIG. 9B) do not necessarily change in the direction for correcting the characteristic change of the transistor included in the delay circuit 200. As a result, the delay time is not allowed to be suppressed or controlled.

In the first correction circuit 210 (FIG. 9A) and the second correction circuit 220 (FIG. 9B), when the resistance is dispersed in accordance with the production parameters (for example, when, as shown in FIG. 15A, a current-voltage characteristic 402a of the resistor 302 is changed into a current-voltage characteristic 402b in the first correction circuit 210), the PO output voltage is changed from voltage A to voltage B as shown in FIG. 15A. When, as shown in FIG. 15B, the current-voltage characteristic 404a of the resistor 304 is changed into a current-voltage characteristic 404c in the second correction circuit 220, the NO output voltage is changed from voltage C to voltage D as shown in FIG. 15B.

When the PO output voltage B and the NO output voltage D do not exceed the threshold voltages of the Pch transistor 204a and the Nch transistor 204b (FIG. 8), respectively, the delay circuit 200 may not operate as a delay circuit. In the first correction circuit 210 and the second correction circuit 220 shown in FIGS. 9A and 9B, the PO output voltage and the NO output voltage undesirably may not exceed the respective threshold voltages of the Pch transistor 204a and the Nch transistor 204b shown in FIG. 8, depending on the manner that the resistance is dispersed.

When actually used, in the first correction circuit 210 and the correction circuit 220 (FIGS. 9A and 9B), a shoot-through current constantly flows between the supply terminal VCC and the ground terminal GND.

One proposal to avoid this is to set, in a semiconductor memory device or the like having a standby function, a signal for canceling the standby function (CEB signal), such that the device is in the standby-released state when the CEB signal is at the GND level (L level) and in the standby state when CEB signal is at the VCC level (H level).

FIG. 16 is a circuit diagram of a correction circuit system 230 for inputting a CEB signal to the first correction circuit 210 and the second correction circuit 220 (FIG. 8). The circuit configuration is disclosed in Japanese Laid-Open Publication No. 7-38394.

In the correction circuit system 230, a CEB signal is input to the gate electrode of the Pch transistor 301 included in the first correction circuit 210, and a signal inverted by an inverter circuit 305 is input to the gate electrode of the Nch transistor 303 included in the second correction circuit 220.

The correction circuit system 230 operates as follows, for example. When a CEB signal is changed from the H level to the L level so as to change the standby state into the standby-released state, the PO node shown in FIG. 16 is changed from the GND level to the PO output level (FIG. 10A). In the case where the voltage is changed in this manner, the current is changed as follows. When the voltage of the PO node (FIG. 16) is at the GND level, the current flowing between the source electrode and the drain electrode is as represented by level c (FIG. 10A). Until the PO output voltage shown in FIG. 10A is obtained, the current is changed from level c to level a (FIG. 10A) so as to charge the load connected to the PO node. The change of the current from level C to level a is based on the saturation region operation characteristics of the Pch transistor 301 shown in FIG. 16. Thus, level C and level a are substantially equal to each other.

Similarly, the NO node voltage shown in FIG. 16 is changed from the VCC level to the NO output voltage level (FIG. 10B). In the case where the voltage is changed in this manner, the current is changed as follows. The current flowing between the source electrode and the drain electrode is changed from level d to level b (FIG. 10B) so as to charge the load connected to the NO node. The change of the current from level d to level b is based on the saturation region operation characteristics of the Nch transistor 303 shown in FIG. 16. Thus, level d and level b are substantially equal to each other.

In the correction circuit system 230, a shoot-through current flows between the supply terminal VCC and the ground terminal GND while the CEB signal is at the GND level. This current is at level a and level b shown in FIGS. 10A and 10B. Generally in a semiconductor memory device and the like, the resistors and the capability of the transistors are adjusted to suppress such a shoot-through current, and thus to reduce the overall power consumption.

However, this involves the following problem. When, for example, the driving load of the PO node and the NO node shown in FIG. 16 is excessively large, if the above-mentioned shoot-through current is reduced, the time period in which the voltage changes from the GND level to the PO output voltage (FIG. 10A) and the time period in which the voltage changes from the VCC level to the NO output voltage (FIG. 10B) may be undesirably extended in the standby-released state in which the CEB signal is changed from the H level to the L level. This is caused because the current is restricted by the saturation region current of the Pch transistor 301 and the Nch transistor 303 (FIG. 16). The correction circuit system 230 provides the correction effect only when the PO output voltage (FIG. 10A) and the NO output voltage (FIG. 10B) are obtained. Therefore, when the time period until such a voltage is obtained from the standby-released state is too long, the correction circuit system 230 and the delay circuit including the correction circuit system 230 cannot be actually used for such a long time.

Conventionally, when the delay circuit needs to be used in a short time after the standby function is released, the current at level a (FIG. 10A) and the current at level b (FIG. 10B) are increased so that the saturation region current of the Pch transistor 301 and the Nch transistor 303 (FIG. 16) is increased. In this way, the current from level C to level a shown in FIG. 10A and the current from level d to level b shown in FIG. 10B are increased, which shortens the time period until the PO output voltage and the NO output voltage are obtained. However, this technique prevents reduction in the power consumption in the semiconductor memory device using the correction circuit system 230 (FIG. 16).

SUMMARY OF THE INVENTION

According to one aspect of the invention, a correction circuit, for generating a control signal for correcting a characteristic change of a first transistor, includes a control signal adjusting section including a constant voltage reduction element for determining either one of a maximum voltage and a minimum voltage of the control signal and a second transistor for determining a characteristic of the control signal, a gate electrode of the second transistor receiving a prescribed voltage; and a resistor section including two types of resistor elements having resistance values of different temperature dependency characteristics from each other, the resistor elements being connected in series. The constant voltage reduction element, the second transistor, and the resistor section are connected in series between a supply terminal and a ground terminal. The control signal is output from a connection point between the control signal adjusting section and the resistor section.

In one embodiment of the invention, the correction circuit further includes a further constant voltage reduction element for determining one of the maximum voltage and the minimum voltage of the control signal, wherein the second transistor and the further constant voltage reduction element are connected in parallel.

In one embodiment of the invention, the constant voltage reduction element and the further constant voltage reduction element include one of a transistor having a diode connection and a diode biased in a forward direction.

In one embodiment of the invention, the two types of resistor elements are a polycrystalline silicon resistor element and a diffusion resistor element formed of polycrystalline silicon containing impurities incorporated thereto.

In one embodiment of the invention, the correction circuit further includes a switching element for blocking a DC current path between the supply terminal and the ground terminal, wherein the constant voltage reduction element, the second transistor, the resistor section, and the switching element are connected in series.

In one embodiment of the invention, the constant voltage reduction element is a first p-channel transistor having a diode connection. The second transistor is a second p-channel transistor, and the prescribed voltage is a ground voltage. One of two ends of the resistor section is connected to the ground terminal. The control signal is output from a connection point between the control signal adjusting section and the other end of the resistor section.

In one embodiment of the invention, the constant voltage reduction element is a first p-channel transistor having a diode connection. The second transistor is a second p-channel transistor and the prescribed voltage is a ground voltage. The further constant voltage reduction element includes a plurality of third p-channel transistors connected in series, the plurality of p-channel transistors each having a diode connection. One of two ends of the resistor section is connected to the ground terminal. The control signal is output from a connection point between the other end of the resistor section and a parallel connection portion of the second transistor and the further constant voltage reduction element.

In one embodiment of the invention, the correction circuit further includes a third p-channel transistor for blocking a DC current path between the supply terminal and the ground terminal, wherein the constant voltage reduction element, the second transistor, the resistor section and the third p-channel transistor are connected in series.

In one embodiment of the invention, the correction circuit further includes a fourth p-channel transistor for blocking a DC current path between the supply terminal and the ground terminal, wherein the constant voltage reduction element, the second transistor, the resistor section and the fourth p-channel transistor are connected in series.

In one embodiment of the invention, the constant voltage reduction element is a first n-channel transistor having a diode connection. The second transistor is a second n-channel transistor, and the prescribed voltage is a supply voltage. One of two ends of the resistor section is connected to the supply terminal. The control signal is output from a connection point between the control signal adjusting section and the other end of the resistor section.

In one embodiment of the invention, the constant voltage reduction element is a first n-channel transistor having a diode connection. The second transistor is a second n-channel transistor and the prescribed voltage is a supply voltage. The further constant voltage reduction element includes a plurality of third n-channel transistors connected in series, the plurality of n-channel transistors each having a diode connection. One of two ends of the resistor section is connected to the supply terminal. The control signal is output from a connection point between the other end of the resistor section and a parallel connection portion of the second transistor and the further constant voltage reduction element.

In one embodiment of the invention, the correction circuit further includes a third n-channel transistor for blocking a DC current path between the supply terminal and the ground terminal, wherein the constant voltage reduction element, the second transistor, the resistor section and the third n-channel transistor are connected in series.

In one embodiment of the invention, the correction circuit further includes a fourth n-channel transistor for blocking a DC current path between the supply terminal and the ground terminal, wherein the constant voltage reduction element, the second transistor, the resistor section and the fourth n-channel transistor are connected in series.

According to another aspect of the invention, a delay circuit includes a logic inversion circuit; a correction circuit for generating a control signal for correcting a characteristic change of the logic inversion circuit; and a first transistor connected between the logic inversion circuit and a supply terminal. The correction circuit includes a control signal adjusting section including a constant voltage reduction element for determining either one of a maximum voltage and a minimum voltage of the control signal and a second transistor for determining a characteristic of the control signal, a gate electrode of the second transistor receiving a prescribed voltage; and a resistor section including two types of resistor elements having resistance values of different temperature dependency characteristics from each other, the resistor elements being connected in series. The constant voltage reduction element, the second transistor, and the resistor section are connected in series between a supply terminal and a ground terminal. The control signal is output from a connection point between the control signal adjusting section and the resistor section and input to a gate electrode of the first transistor.

According to still another aspect of the invention, a delay circuit includes a first logic inversion circuit; a second logic inversion circuit connected to the first logic inversion circuit in series; a first correction circuit for generating a first control signal for correcting a characteristic change in the first logic inversion circuit; a second correction circuit for generating a second control signal for correcting a characteristic change in the second logic inversion circuit; a p-channel transistor connected between the first logic inversion circuit and a supply terminal; and an n-channel transistor connected between the second logic inversion circuit and a ground terminal. The first correction circuit includes a first control signal adjusting section including a first constant voltage reduction element for determining a maximum voltage of the first control signal and a first transistor for determining a characteristic of the first control signal, a gate electrode of the first transistor receiving a first prescribed voltage; and a first resistor section including two types of resistor elements having resistance values of different temperature dependency characteristics from each other, the resistor elements being connected in series. The first constant voltage reduction element, the first transistor, and the first resistor section are connected in series between the supply terminal and the ground terminal. The first control signal is output from a connection point between the first control signal adjusting section and the first resistor section and input to a gate electrode of the p-channel transistor. The second correction circuit includes a second control signal adjusting section including a second constant voltage reduction element for determining a minimum voltage of the second control signal and a second transistor for determining a characteristic of the second control signal, a gate electrode of the second transistor receiving a second prescribed voltage; and a second resistor section including two types of resistor elements having resistance values of different temperature dependency characteristics from each other, the resistor elements being connected in series. The second constant voltage reduction element, the second transistor, and the second resistor section are connected in series between the supply terminal and the ground terminal. The second control signal is output from a connection point between the second control signal adjusting section and the second resistor section and input to a gate electrode of the n-channel transistor.

According to still another aspect of the invention, a ring oscillator circuit includes an odd number of logic inversion circuits connected in series; a first correction circuit for generating a first control signal for correcting a characteristic change in the odd number of logic inversion circuits; a second correction circuit for generating a second control signal for correcting a characteristic change in the odd number of logic inversion circuits; a plurality of p-channel transistors each connected between a corresponding one of the odd number of logic inversion circuits and a supply terminal; and a plurality of n-channel transistors each connected between a corresponding one of the odd number of logic inversion circuits and a ground terminal. Among the odd number of logic inversion circuits, a first logic inversion circuit and a second logic inversion circuit are connected in series in a feedback manner. The first correction circuit includes a first control signal adjusting section including a first constant voltage reduction element for determining a maximum voltage of the first control signal and a first transistor for determining a characteristic of the first control signal, a gate electrode of the first transistor receiving a first prescribed voltage; and a first resistor section including two types of resistor elements having resistance values of different temperature dependency characteristics from each other, the resistor elements being connected in series. The first constant voltage reduction element, the first transistor, and the first resistor section are connected in series between the supply terminal and the ground terminal. The first control signal is output from a connection point between the first control signal adjusting section and the first resistor section and input to a gate electrode of each of the p-channel transistors. The second correction circuit includes a second control signal adjusting section including a second constant voltage reduction element for determining a minimum voltage of the second control signal and a second transistor for determining a characteristic of the second control signal, a gate electrode of the second transistor receiving a second prescribed voltage; and a second resistor section including two types of resistor elements having resistance values of different temperature dependency characteristics from each other, the resistor elements being connected in series. The second constant voltage reduction element, the second transistor, and the second resistor section are connected in series between the supply terminal and the ground terminal. The second control signal is output from a connection point between the second control signal adjusting section and the second resistor section and input to a gate electrode of each of the plurality of n-channel transistors.

The present invention provides a correction circuit for generating a control signal for correcting a change in the transistor characteristics caused by production conditions and physical conditions including supply voltage and temperature. In such a correction circuit, two types of resistors having different temperature dependency characteristics of the resistance value (for example, a resistor having a positive temperature dependency and a resistor having a negative temperature dependency) are connected to each other in series, and thus a resistor section having a desired temperature dependency is produced. Thus, the dispersion in delay time caused by the temperature dependency of the resistors can be controlled.

According to the present invention, a transistor for receiving a prescribed gate voltage and a constant voltage reducing element including a transistor having a diode connection (or a diode biased in a forward direction) are connected in series. The transistor for receiving the prescribed gate voltage acts as an element for determining the characteristics of the output voltage of the correction circuit. The constant voltage reducing element is used to control the maximum possible voltage and the minimum possible voltage which are output from the correction circuit, so that the delay circuit is prevented from not operating due to the dispersion in production parameters of the resistors.

According to the present invention, a transistor for receiving a prescribed gate voltage and an additional constant voltage reducing element including a transistor having a diode connection (or a diode biased in a forward direction) are connected in parallel. While the output voltage from the correction circuit is changed to a desired voltage, the characteristics of the correction voltage can be determined by the additional constant voltage reducing element. Therefore, when the correction circuit has a standby function and is released from the standby state, the output voltage from the correction circuit can be changed to a desired voltage rapidly.

Accordingly, the present invention provides a stable delay time regardless of dispersion in supply voltage, temperature, production parameters or the like. Moreover, the dependency of the circuit on dispersion in supply voltage, temperature, production parameters or the like can be arbitrarily controlled to determine the delay time. In the case where a delay circuit is operated rapidly in a semiconductor integrated circuit having a standby function, the power consumption can be reduced. In the case where a boost circuit such as a charge pump or the like includes a ring oscillator circuit according to the present invention, the maximum operation current can be restricted.

Thus, the invention described herein makes possible the advantages of providing a correction circuit, a delay circuit and a ring oscillator circuit for controlling the dispersion in delay time caused by the temperature-dependent characteristic of the resistor, for preventing the delay circuit from not operating in accordance with the production parameters of the resistor, and, when the correction circuit has a standby function, for changing the output voltage from the correction circuit to a desired voltage in a standby-released state.

These and other advantages of the present invention will become apparent to those skilled in the art upon reading and understanding the following detailed description with reference to the accompanying figures.

BRIEF DESCRIPTION OF THE DRAWINGS

FIG. 15A is a graph illustrating a current-voltage characteristic of the conventional first correction circuit when the resistance is changed;

FIG. 15B is a graph illustrating a current-voltage characteristic of the conventional second correction circuit when the resistance is changed.

DESCRIPTION OF THE PREFERRED EMBODIMENTS

Hereinafter, the present invention will be described by way of illustrative examples with reference to the accompanying drawings.

Figure 1:
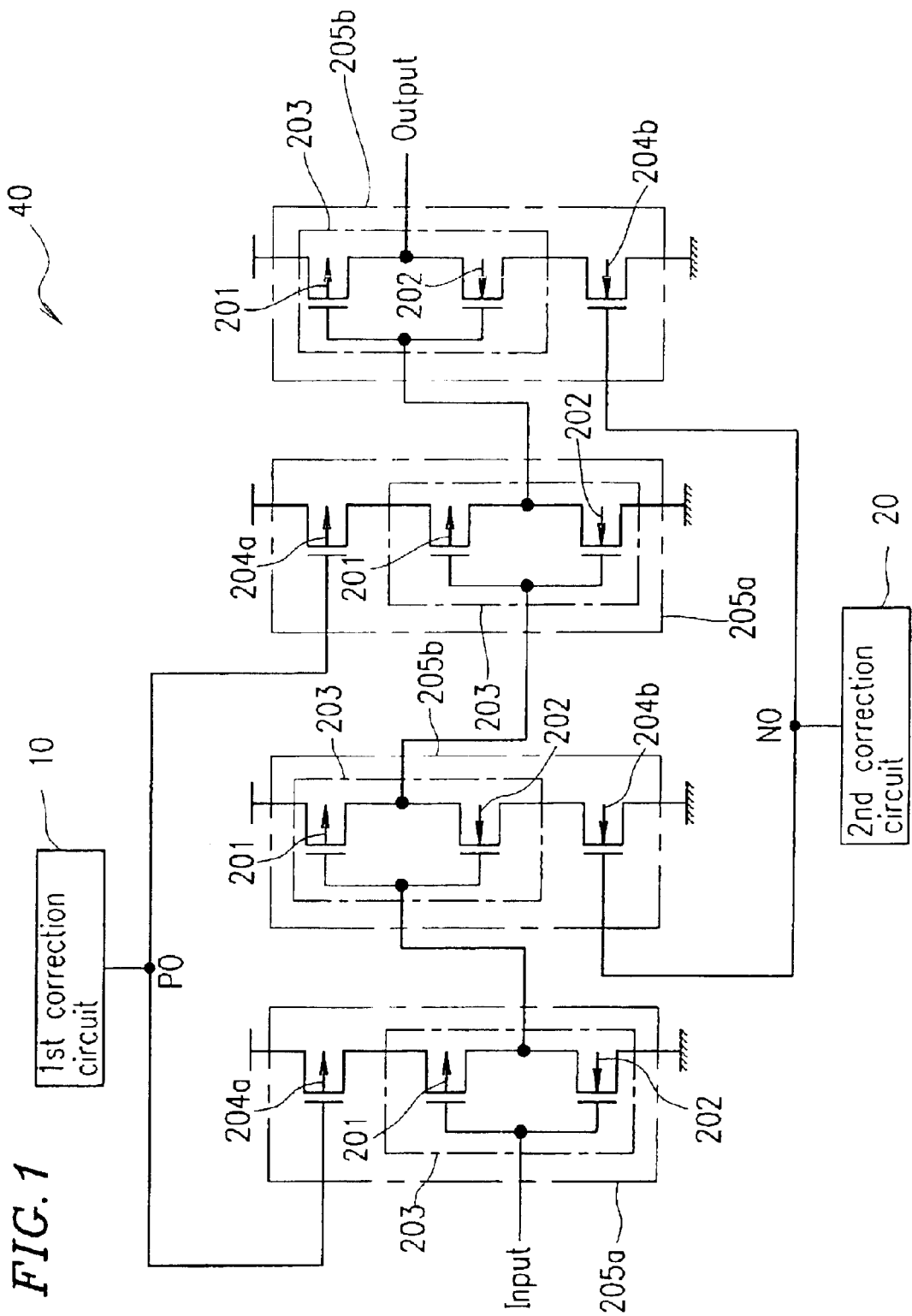
FIG. 1 is a circuit diagram illustrating a delay circuit according to one example of the present invention.

FIG. 1 shows a circuit configuration of a delay circuit 40 according to one example of the present invention. Identical elements previously discussed with respect to FIGS. 8 and 16 bear identical reference numerals and the detailed descriptions thereof will be omitted.

Figure 8:
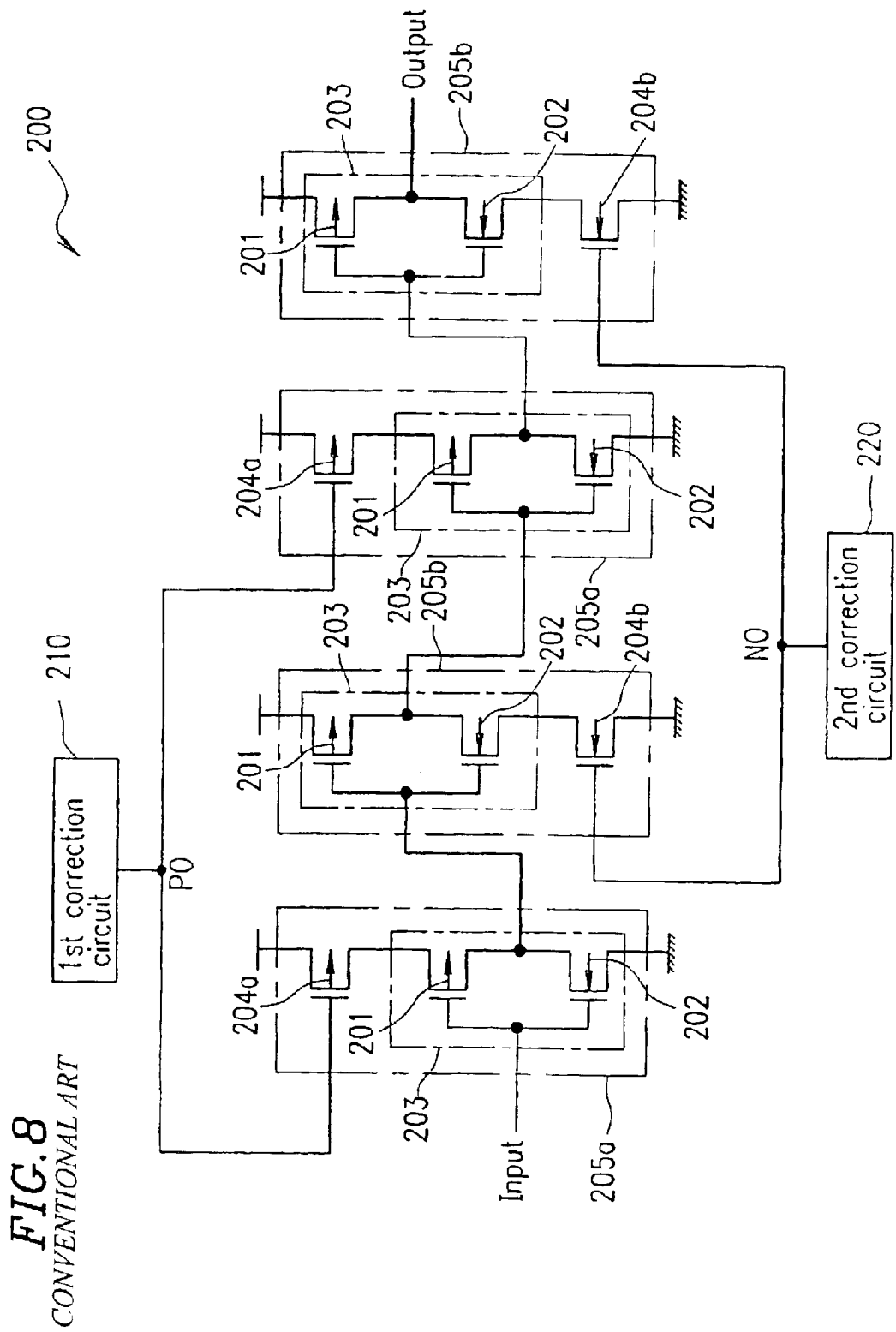
FIG. 8 is a circuit diagram illustrating another conventional delay circuit.

The delay circuit 40 includes a first correction circuit 10 and a second correction circuit 20 instead of the first correction circuit 210 and the second correction circuit 220 of the delay circuit 200 shown in FIG. 8. The gate electrode of the Pch transistor 204a included in the inverter circuit 205a receives a voltage (control signal) generated in the first correction circuit 10. The gate electrode of the Nch transistor 204b included in the inverter circuit 205b receives a voltage (control signal) generated in the second correction circuit 20. Other than these points, the delay circuit 40 has the same structure as that of the delay circuit 200.

Figure 2:
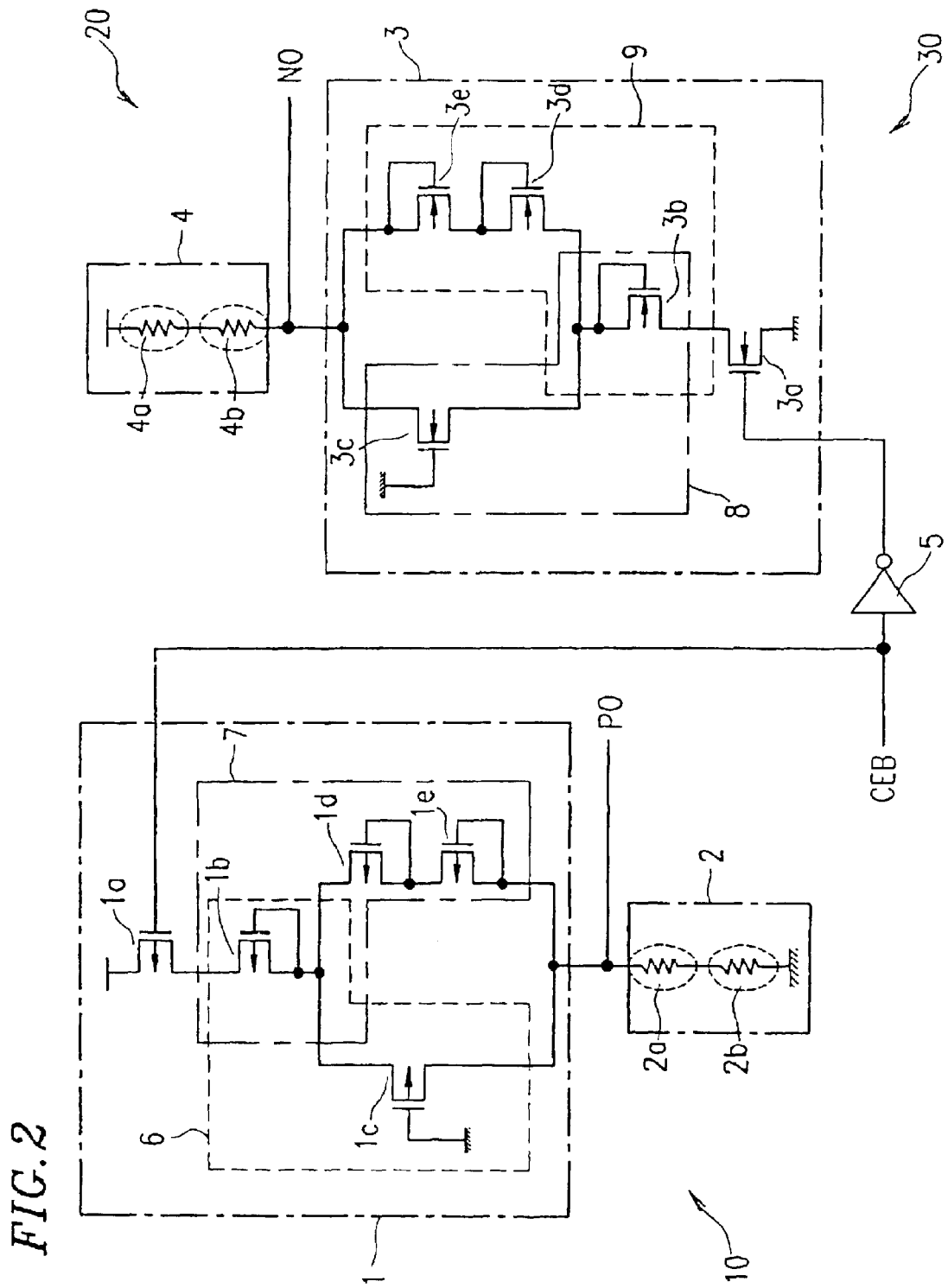
FIG. 2 is a circuit diagram illustrating a correction circuit system according to one example of the present invention.

FIG. 2 shows a circuit configuration of a correction circuit system 30 according to one example of the present invention.

Figure 16:
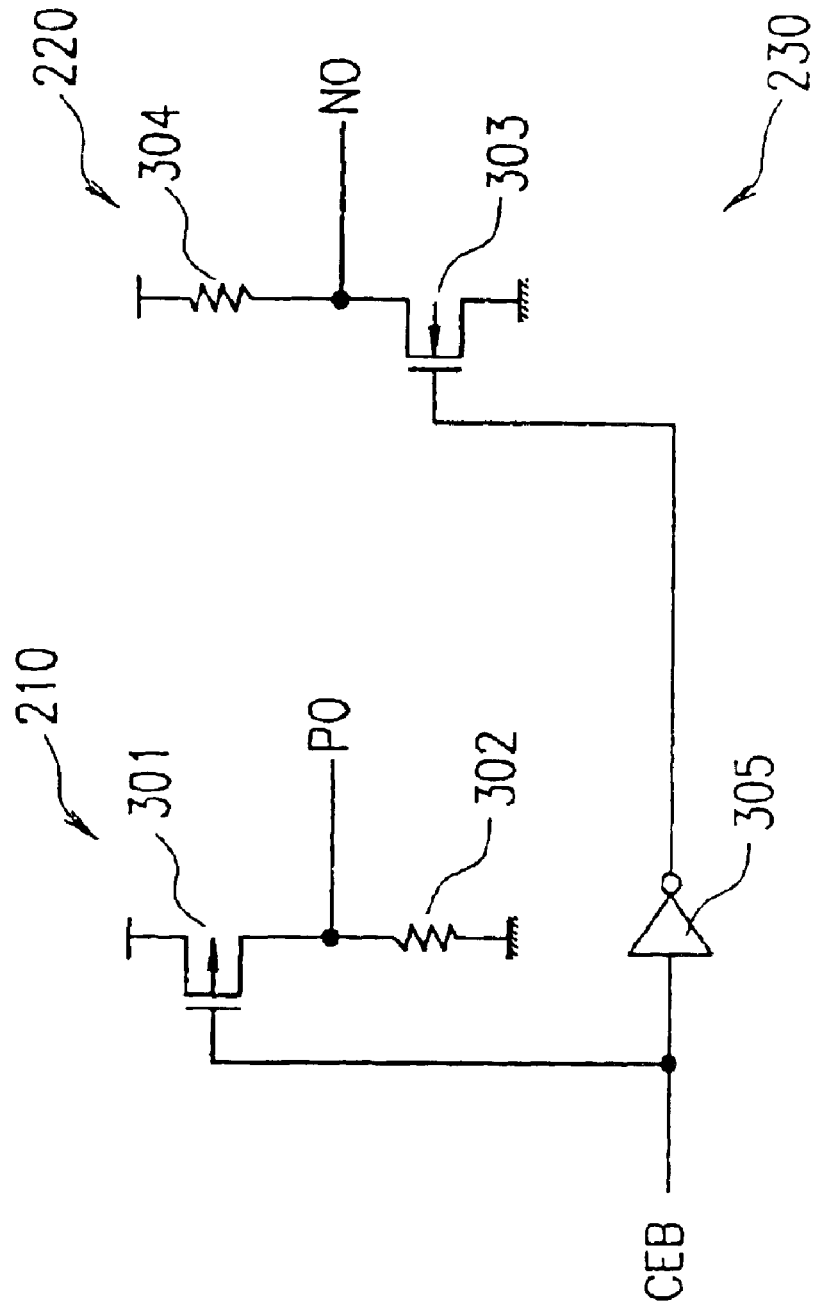
FIG. 16 is a circuit diagram illustrating a conventional correction circuit having a standby function.

The correction circuit system 30 includes a first correction circuit 10 and a second correction circuit 20 instead of the first correction circuit 210 and the second correction circuit 220 shown in FIG. 16. The first correction circuit 10 and the second correction circuit 20 shown in FIG. 2 correspond to the first correction circuit 10 and the second correction circuit 20 shown in FIG. 1.

The first correction circuit 10 and the second correction circuit 20 generate a control signal for correcting a characteristic change of at least one transistor included in the logic inversion circuit 203 (i.e., a characteristic change of the logic inversion circuit 203).

The first correction circuit 10 includes a transistor section 1 including a plurality of transistors 1a through 1e, and a resistor section 2 including two types of resistors 2a and 2b. The transistor section 1 and the resistor section 2 are connected in series in this order between the supply terminal and the ground terminal. A connection point (PO node) between the transistor section 1 and the resistor section 2 outputs a voltage (control signal) PO.

The transistor section 1 of the first correction circuit 10 includes a first transistor section (control signal adjusting section) 6 and a second transistor section 7. The first transistor section 6 includes a Pch transistor 1b in which a gate electrode and a drain electrode are connected to each other (diode connection) and a Pch transistor 1c. The Pch transistor 1c is connected in series to the Pch transistor 1b and has a gate electrode connected to the ground terminal GND which has a prescribed potential. The Pch transistor 1c acts as an element for determining a characteristic of the control signal, and the Pch transistor 1b acts as a constant voltage reduction element having a function of determining the maximum voltage of the control signal.

The second transistor section 7 includes the Pch transistor 1b which is shared with the first transistor 6, and a Pch transistor 1d having a diode connection and connected in series to the Pch transistor 1b, and a Pch transistor 1e having a diode connection and connected in series to the Pch transistor 1d. The Pch transistors 1d and 1e included in the second transistor section 7 and the Pch transistor 1a included in the first transistor section 6 are connected in parallel. The Pch transistors 1d and 1e act as further constant voltage reduction elements having a function of determining the maximum voltage of the control signal.

A Pch transistor 1a is connected in series between the Pch transistor 1b and the supply terminal, as a switching element for blocking a DC current path between the supply terminal and the ground terminal. A gate electrode of the Pch transistor 1a receives a CEB signal which is at the GND level (L level) when the circuit is in a standby-released state and is at the VCC level (H level) when the circuit is in a standby state. This blocks the shoot-through current from flowing the supply terminal to the ground terminal when the circuit is in the standby state.

In the resistor section 2 of the first correction circuit 10, the resistors 2a and 2b are connected in series. The resistor 2a has a negative temperature dependency (negative temperature coefficient), and the resistor 2b has a positive temperature dependency (positive temperature coefficient). An exemplary resistor having a negative temperature dependency is a polycrystalline silicon resistor. An exemplary resistor having a positive temperature dependency is a diffusion resistor formed of polycrystalline silicon containing impurities incorporated thereto.

A series connection of the resistor 2a having a negative temperature dependency and the resistor 2b having a positive temperature dependency provides a resistor having a desired temperature dependency. For example, a resistor having no temperature dependency can be produced. The structure of the resistor section 2 as shown in FIG. 2 allows the influence of the temperature dependency characteristic of the resistance on the output voltage in the first correction circuit 10 to be controlled.

The second correction circuit 20 includes a transistor section 3 including a plurality of transistors 3a through 3e, and a resistor section 4 including two types of resistors 4a and 4b. The resistor section 4 and the transistor section 3 are connected in series in this order between the supply terminal and the ground terminal. A connection point (NO node) between the transistor section 3 and the resistor section 4 outputs a voltage (control signal) NO.

The transistor section 3 of the second correction circuit 20 includes a first transistor section (control signal adjusting section) 8 and a second transistor section 9. The first transistor section 8 includes an Nch transistor 3b in which agate electrode and a drain electrode are connected to each other (diode connection) and an Nch transistor 3c. The Nch transistor 3c is connected in series to the Nch transistor 3b and has a gate electrode connected to the ground terminal GND which has a prescribed potential. The Nch transistor 3c acts as an element for determining a characteristic of the control signal, and the Nch transistor 3b acts as a constant voltage reduction element having a function of determining the minimum voltage of the control signal.

The second transistor section 9 includes the Nch transistor 3b which is shared with the first transistor 8, and an Nch transistor 3d having a diode connection and connected in series to the Nch transistor 3b, and an Nch transistor 3e having a diode connection and connected in series to the Nch transistor 3d. The Nch transistors 3d and 3e included in the second transistor section 9 and the Nch transistor 3c included in the first transistor section 8 are connected in parallel. The Nch transistors 3d and 3e act as further constant voltage reduction elements having a function of determining the minimum voltage of the control signal.

An Nch transistor 3a is connected in series between the Nch transistor 3b and the supply terminal, as a switching element for blocking a DC current path between the supply terminal and the ground terminal. A CEB signal is at the GND level (L level) when the circuit is in a standby-released state and is at the VCC level (H level) when the circuit is in a standby state. A gate electrode of the Nch transistor 3a receives an inverted CEB signal, which has been inverted by the inverter circuit 5. This blocks the shoot-through current from flowing the supply terminal to the ground terminal when the circuit is in the standby state.

In the resistor section 4 of the second correction circuit 20, the resistors 4a and 4b are connected in series. The resistor 4a has a negative temperature dependency (negative temperature coefficient), and the resistor 4b has a positive temperature dependency (positive temperature coefficient).

A series connection of the resistor 4a having a negative temperature dependency and the resistor 4b having a positive temperature dependency provides a resistor having a desired temperature dependency. For example, a resistor having no temperature dependency can be produced. The structure of the resistor section 4 as shown in FIG. 2 allows the influence of the temperature dependency characteristic of the resistance on the output voltage in the second correction circuit 20 to be controlled.

An operation of the first correction circuit 10 and the second correction circuit 20 in the correction circuit system 30 having the above-described structure will be described. The output voltage of the first correction circuit 10 is determined by the current-voltage characteristics of the transistor section 1 and the current-voltage characteristics of the resistor section 2. The output voltage of the second correction circuit 20 is determined by the current-voltage characteristics of the transistor section 3 and the current-voltage characteristics of the resistor section 4.

Figure 3:
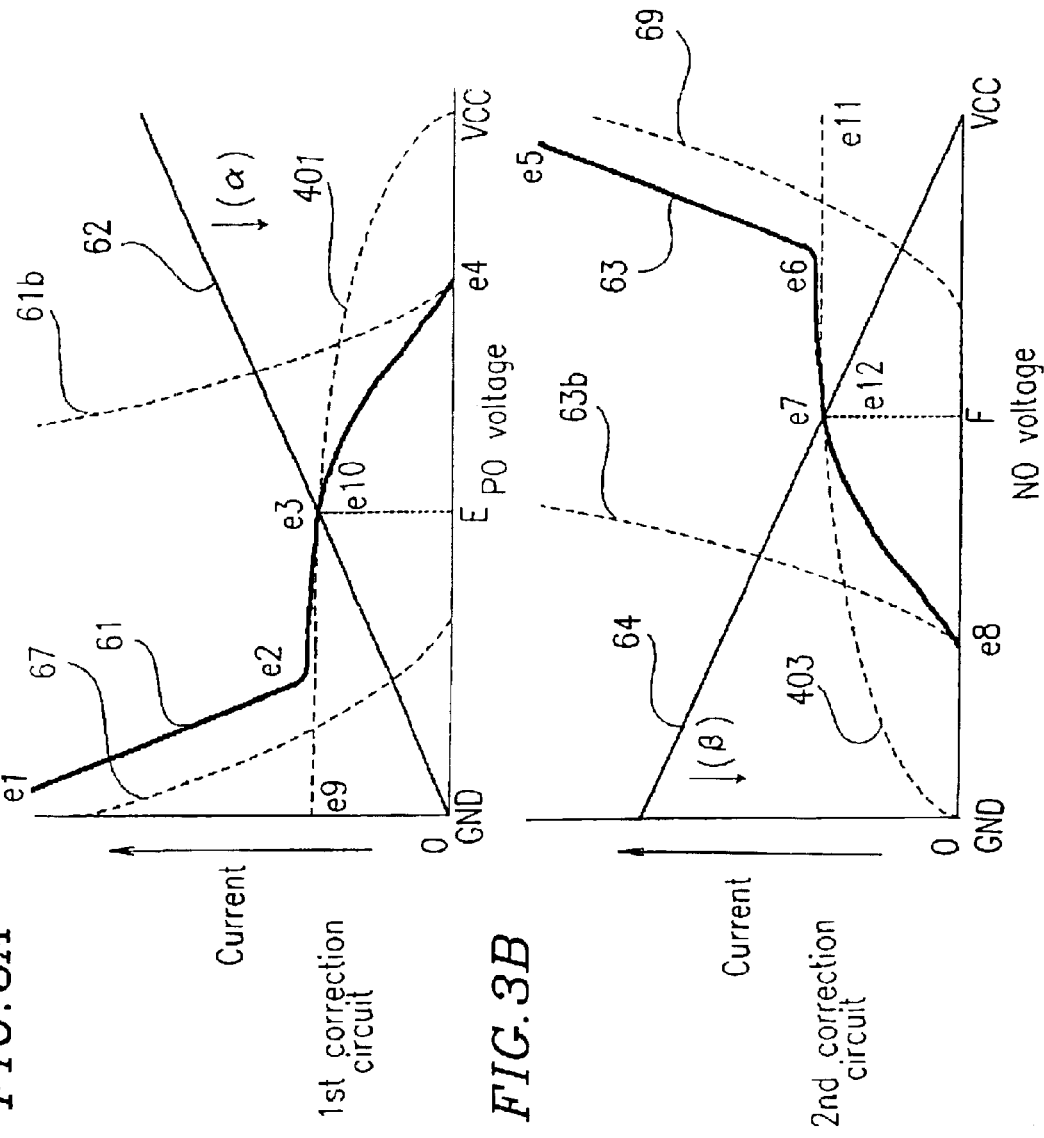
FIG. 3A is a graph illustrating a current-voltage characteristic of a first correction circuit according to one example of the present invention.
FIG. 3B is a graph illustrating a current-voltage characteristic of a second correction circuit according to one example of the present invention.

FIG. 3A is a graph illustrating the current-voltage characteristics of the transistor section 1 and the resistor section 2 included in the first correction circuit 10. FIG. 3B is a graph illustrating the current-voltage characteristics of the transistor section 3 and the resistor section 4 included in the second correction circuit 20.

In FIG. 3A, regarding the current-voltage characteristic of the transistor section 1, the horizontal axis represents the PO output voltage. When the PO output voltage is at the GND level, the voltage difference between both ends of the transistor section 1 is VCC−GND. When the PO output voltage is at the VCC level, the voltage difference between both ends of the transistor section 1 is 0. The vertical axis represents the current flowing through the transistor section 1. Regarding the current-voltage characteristic of the resistor section 2, the horizontal axis represents the PO output voltage. When the PO output voltage is at the GND level, the voltage difference between both ends of the resistor section 2 is 0. When the PO output voltage is at the VCC level, the voltage difference between both ends of the resistor section 2 is VCC−GND. The vertical axis represents the current flowing through the resistor section 2.

In FIG. 3B, regarding the current-voltage characteristic of the transistor section 3, the horizontal axis represents the NO output voltage. When the NO output voltage is at the GND level, the voltage difference between both ends of the transistor section 3 is 0. When the NO output voltage is at the VCC level, the voltage difference between both ends of the transistor section 3 is VCC–GND. The vertical axis represents the current flowing through the transistor section 3. Regarding the current-voltage characteristic of the resistor section 4, the horizontal axis represents the NO output voltage. When the NO output voltage is at the GND level, the voltage difference between both ends of the resistor section 4 is VCC–GND. When the NO output voltage is at the VCC level, the voltage difference between both ends of the resistor section 4 is 0. The vertical axis represents the current flowing through the resistor section 4.

A characteristic 61 in FIG. 3A represents the current-voltage characteristic of the transistor section 1 included in the first correction circuit 10, and a characteristic 63 in FIG. 3B represents the current-voltage characteristic of the transistor section 3 included in the second correction circuit 20. A characteristic 62 in FIG. 3A represents the current-voltage characteristic of the resistor section 2 included in the first correction circuit 10, and a characteristic 64 in FIG. 3B represents the current-voltage characteristic of the resistor section 4 included in the second correction circuit 20. A characteristic 67 (FIG. 3A) is a current-voltage characteristic of the serial connection of the Pch transistor 1*b* having a diode connection, the Pch transistor 1*d*, and the Pch transistor 1*e* included in the second transistor section 7. A characteristic 69 (FIG. 3B) is a current-voltage characteristic of the serial connection of the Nch transistor 3*b* having a diode connection, the Nch transistor 3*d*, and the Nch transistor 3*e* included in the second transistor section 9. A characteristic 61*b* (FIG. 3A) represents a current-voltage characteristic of the Pch transistor 1*b* itself included in the first correction circuit 10. A characteristic 63*b* (FIG. 3B) represents a current-voltage characteristic of the Nch transistor 3*b* itself included in the second correction circuit 20.

Figure 9A:
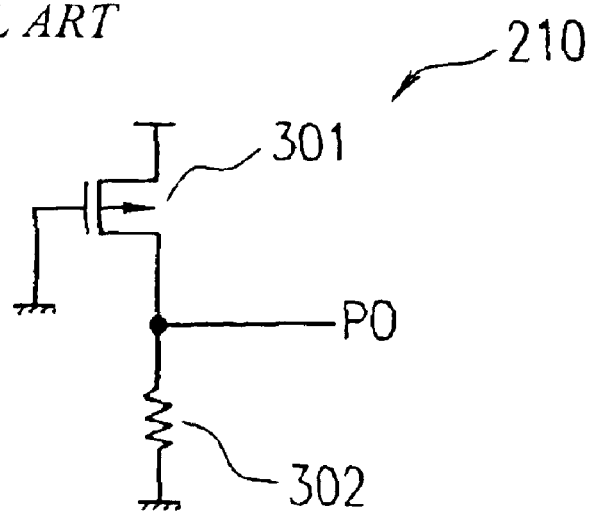
FIG. 9A shows a conventional first correction circuit.
Figure 9B:
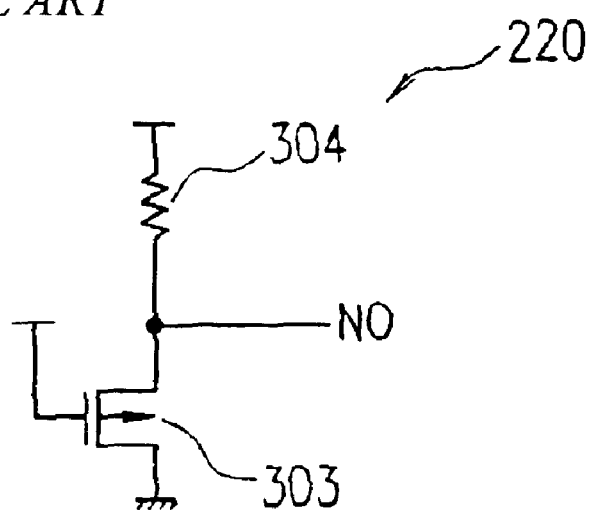
FIG. 9B shows a conventional second correction circuit.
Figure 10A:
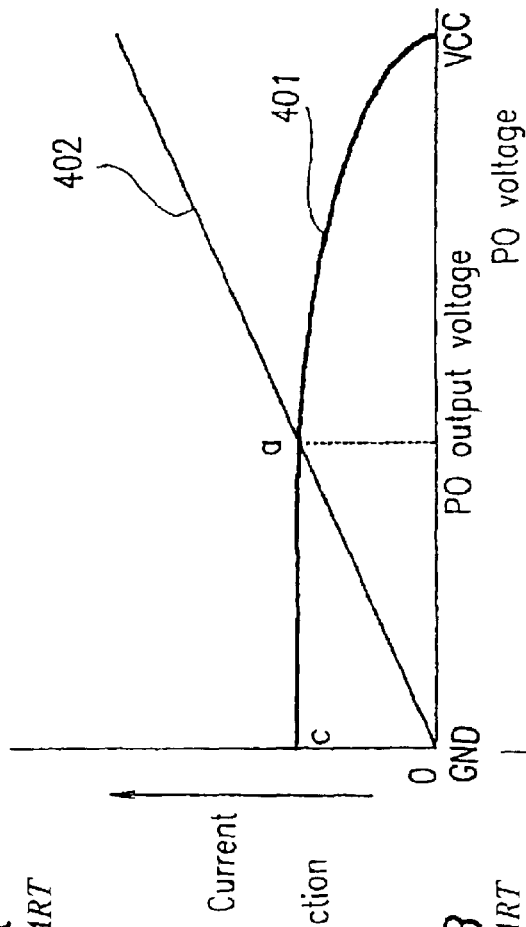
FIG. 10A is a graph illustrating a current-voltage characteristic of the conventional first correction circuit.
Figure 10B:
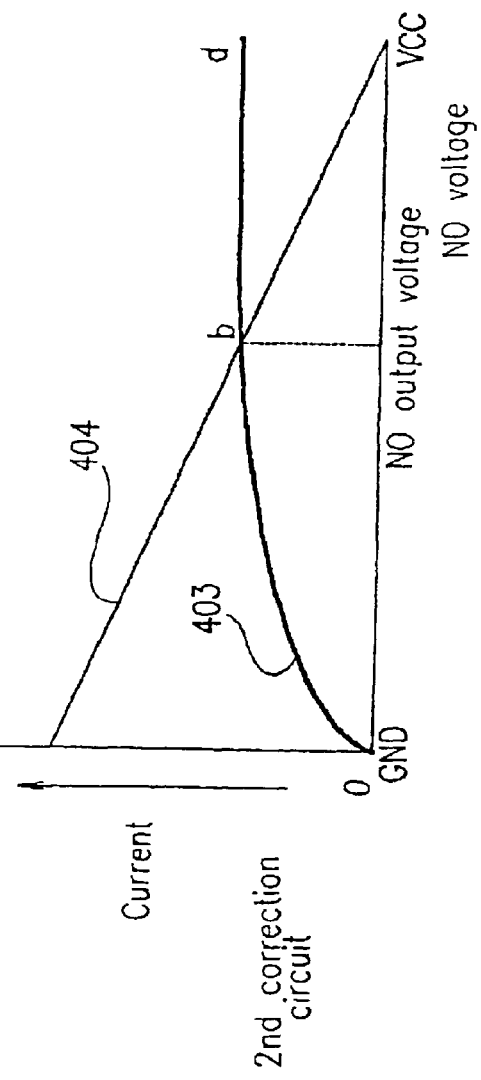
FIG. 10B is a graph illustrating a current-voltage characteristic of the conventional second correction circuit.
Figure 11A:
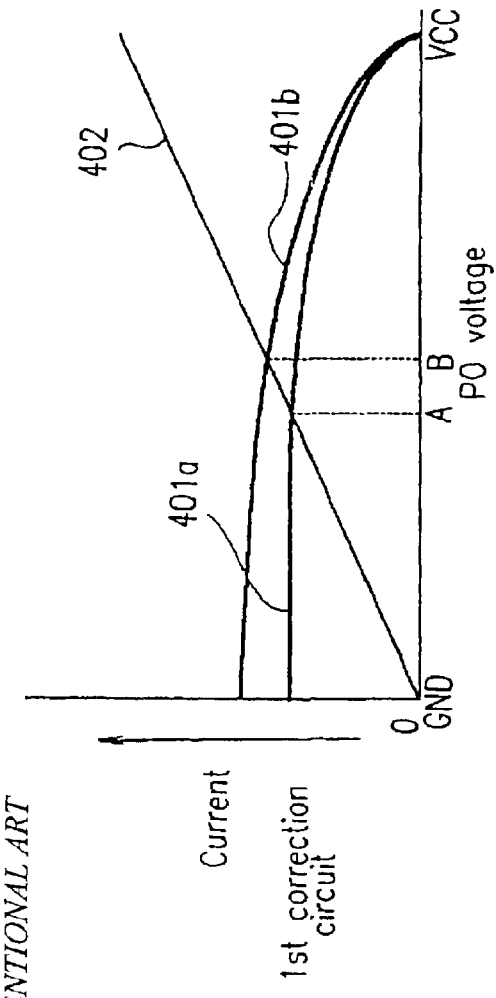
FIG. 11A is a graph illustrating a current-voltage characteristic of the conventional first correction circuit when the ambient temperature is changed.
Figure 11B:
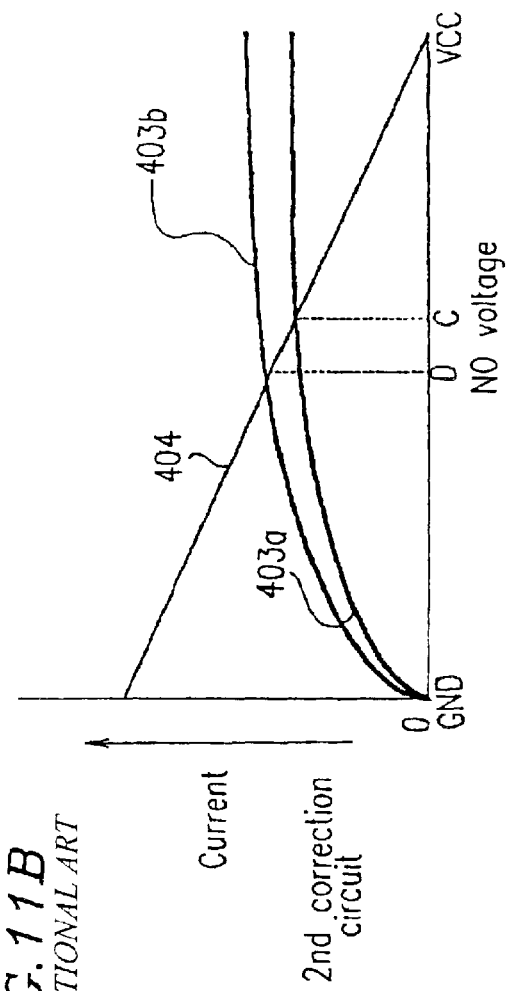
FIG. 11B is a graph illustrating a current-voltage characteristic of the conventional second correction circuit when the ambient temperature is changed.
Figures 12A, 12B:
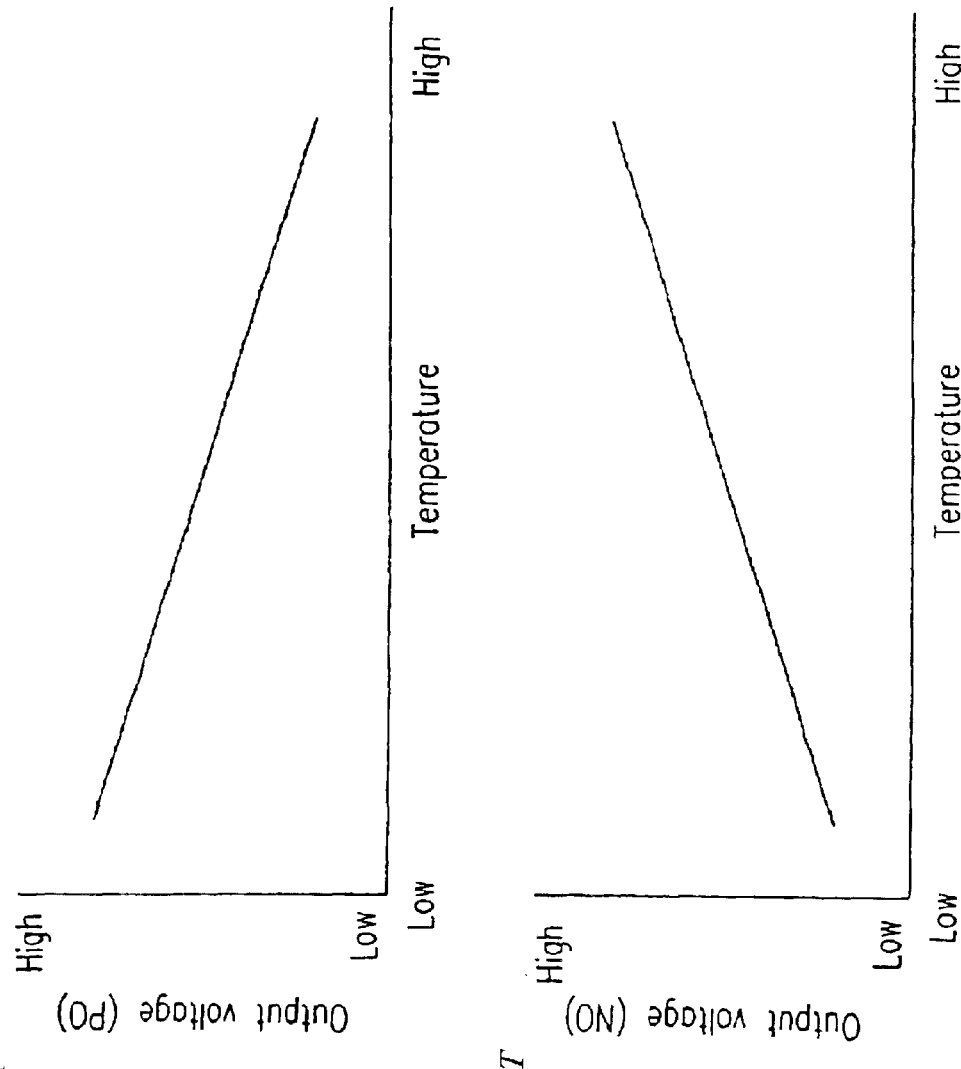
FIG. 12A is a graph illustrating the relationship between the ambient temperature and the output voltage in the conventional first correction circuit.
FIG. 12B is a graph illustrating the relationship between the ambient temperature and the output voltage in the conventional second correction circuit.
Figure 13A:
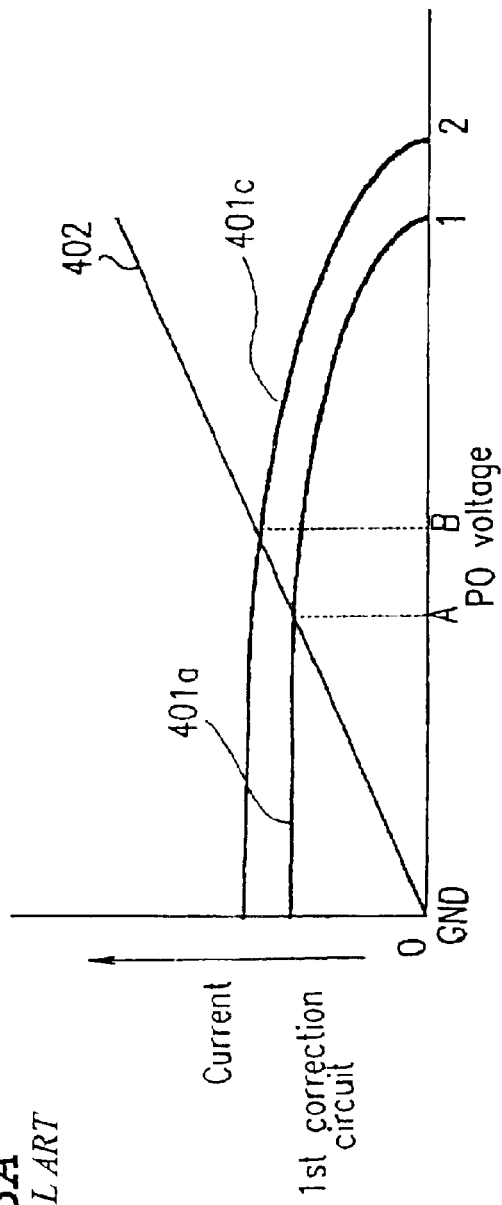
FIG. 13A is a graph illustrating a current-voltage characteristic of the conventional first correction circuit when the supply voltage is changed.
Figure 13B:
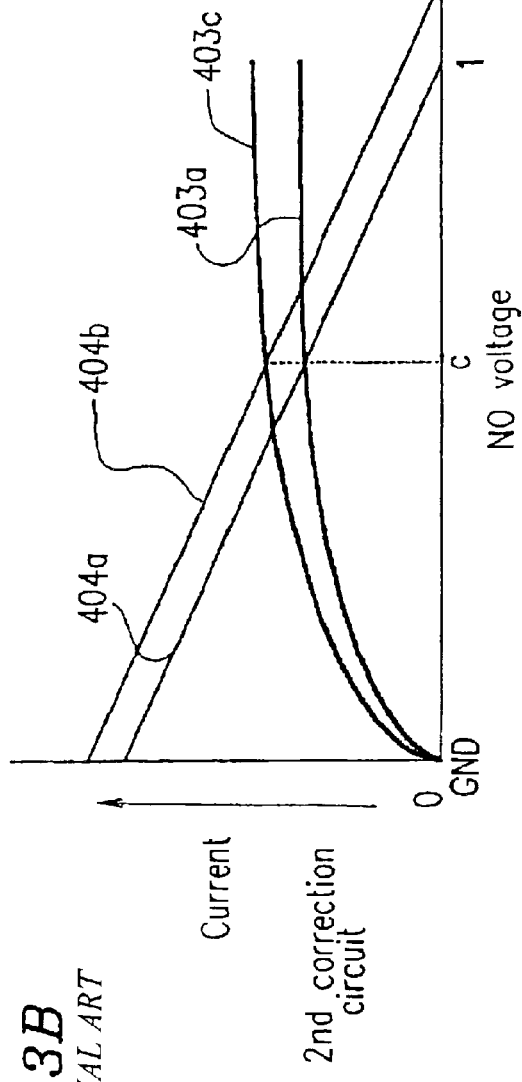
FIG. 13B is a graph illustrating a current-voltage characteristic of the conventional second correction circuit when the supply voltage is changed.
Figure 14A:
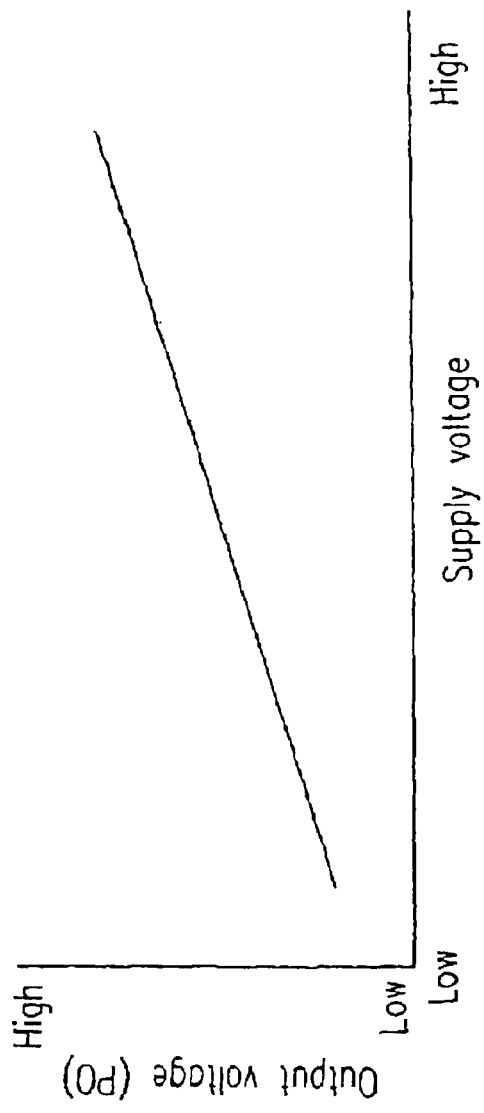
FIG. 14A is a graph illustrating the relationship between the supply voltage and the output voltage in the conventional first correction circuit.
Figure 14B:
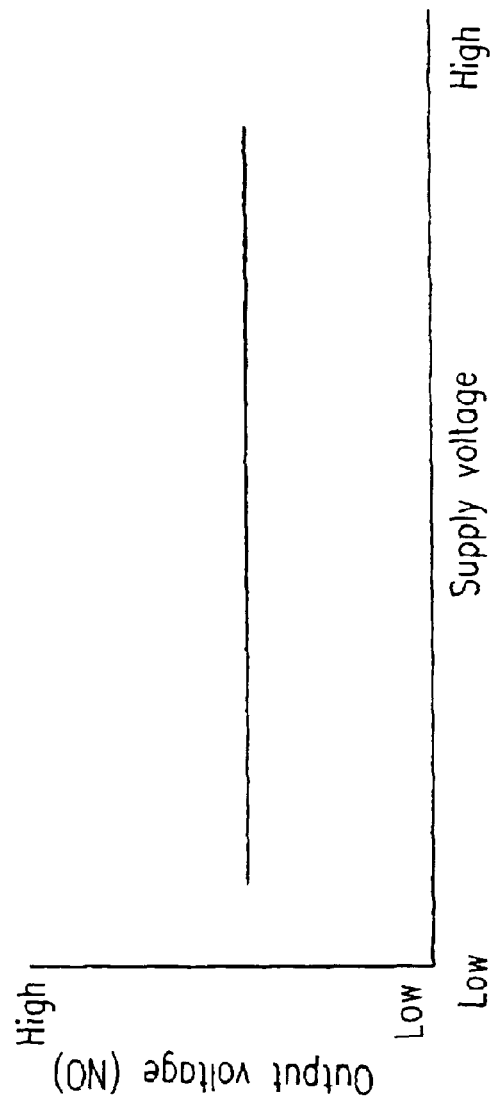
FIG.14B is a graph illustrating the relationship between the supply voltage and the output voltage in the conventional second correction circuit.

In the first correction circuit 10, the transistor section 1 and the resistor section 2 are connected to each other in series. Therefore, an intersection e10 of the characteristic 61 and the characteristic 62 shown in FIG. 3A represents an output voltage E and an output current from the first correction circuit 10. In the second correction circuit 20, the transistor section 3 and the resistor section 4 are connected to each other in series. Therefore, an intersection e12 of the characteristic 63 and the characteristic 64 shown in FIG. 3B represents an output voltage F and an output current from the second correction circuit 20. FIGS. 3A and 3B also show the current-voltage characteristic 401 of the transistor 301 and the current-voltage characteristic 403 of the transistor 303 when the voltages E and F having the same level are output from the conventional first and second correction circuits 210 and 220 shown in FIGS. 9A and 9B, respectively, for comparison.

In the first correction circuit 10, the gate electrode and the drain electrode of the Pch transistor 1*b* are at the same node (diode connection). Therefore, the output voltage from the PO node shown in FIG. 2 is restricted by the threshold voltage of the Pch transistor 1*b*. Accordingly, the maximum value of the PO output voltage is restricted by the current-voltage characteristic 61*b* of the Pch transistor 1*b*, resulting in the maximum value being voltage e4 as shown in FIG. 3A. Even if, for example, the resistance of the resistor section 2 included in the first correction circuit 10 is dispersed and as a result, the current-voltage characteristic 62 of the resistor section 2 shown in FIG. 3A is dispersed in the "α" direction, the PO node shown in FIG. 2 provides an output which is voltage e4 (FIG. 3A) or less. The voltage output from the PO node (FIG. 2) is input to the gate electrode of the Pch transistor 204*a* in the delay circuit 40 (FIG. 1). Since this voltage is lower than or equal to voltage e4 (FIG. 3*a*), which is lower than the threshold voltage of the Pch transistor 204*a* (FIG. 1), the Pch transistor 204*a* is not turned OFF.

Similarly in the second correction circuit 20, the gate electrode and the drain electrode of the Nch transistor 3*b* are at the same node (diode connection). Therefore, the output voltage from the NO node shown in FIG. 2 is restricted by the threshold voltage of the Nch transistor 3*b*. Accordingly, the minimum value of the NO output voltage is restricted by the current-voltage characteristic 63*b* of the Nch transistor 3*b*, resulting the minimum value being voltage e8 as shown in FIG. 3B. Even if, for example, the resistance of the resistor section 4 included in the second correction circuit 20 is dispersed and as a result, the current-voltage characteristic 64 of the resistor section 4 shown in FIG. 3B is dispersed in the "β" direction, the NO node shown in FIG. 2 provides an output which is voltage e8 (FIG. 3B) or more. The voltage output from the NO node (FIG. 2) is input to the gate electrode of the Nch transistor 204*b* in the delay circuit 40 (FIG. 1). Since this voltage is higher than or equal to voltage e8 (FIG. 3B), which is higher than the threshold voltage of the Nch transistor 204*b* (FIG. 1), the Nch transistor 204*b* is not turned OFF.

Accordingly in this example, even if the characteristics of the resistors included in the correction circuit system 30 are dispersed, neither Pch transistor 204*a* nor the Nch transistor 204*b* is turned OFF and thus the delay circuit 40 can be properly operated, since the voltage output from the PO node is lower than the threshold voltage of the Pch transistor 204*a* and the voltage output from the NO node is higher than the threshold voltage of the Nch transistor 204*b*.

As described above, in the conventional first correction circuit 210 shown in FIG. 16, when the voltage at the PO node is changed to the output voltage level in the standby-released state, the current for charging the load connected to the PO node is changed from saturation current region e9 to saturation current region e10 of the current-voltage characteristic 401 shown in FIG. 3A.

In the first correction circuit 10 of this example, the current-voltage characteristic 67 (FIG. 3A) of the serial connection of the Pch transistor 1*b*, having a diode connection, the Pch transistor 1*d*, and the Pch transistor 1*e* which are included in the second transistor section 7 (FIG. 2), shows an output characteristic which is reduced from the supply voltage VCC by the sum of the threshold voltages of the Pch transistors 1*b*, 1*d* and 1*e*. The second transistor section 7 is connected to the first transistor section 6 in parallel. Therefore, when the voltage at the PO node is changed to the output voltage level in the standby-released state, the current for charging the load connected to the PO node is changed from level e1 to e2 to e3 of the current-voltage characteristic 61 (FIG. 3A).

The charging of the load from the PO node by the current changing from level e1 to e2 to e3 (FIG. 3A) in the first correction circuit 10 is clearly more rapid than the charging performed by the current changing from saturation current region e9 to saturation current region e10 in the conventional first correction circuit 210. In the case where it is sufficient to obtain a charging time which is about the same as that provided by the conventional first correction circuit 210, the current changing from level e1 to e2 to e3 can be reduced. It is not necessary to set many saturation region currents as is necessary in the conventional first correction circuit 210, and therefore the shoot-through current flowing from the supply terminal to the ground terminal when the output voltage E (FIG. 3A) is provided can be reduced.

Similarly in the conventional second correction circuit 220 (FIG. 16), when the voltage at the NO node is changed to the output voltage level in the standby-released state, the current for charging the load connected to the NO node is changed from saturation current region e11 to saturation current region e12 of the current-voltage characteristic 403 shown in FIG. 3B.

In the second correction circuit 20 of this example, the current-voltage characteristic 69 (FIG. 3B) of the serial connection of the Nch transistor 3b having a diode connection, the Nch transistor 3d, and the Nch transistor 3e which are included in the second transistor section 9 (FIG. 2) show an output characteristic which is increased from the ground voltage GND by the sum of the threshold voltages of the Nch transistors 3b, 3d and 3e. The second transistor section 9 is connected to the first transistor section 8 in parallel. Therefore, when the voltage at the NO node is changed to the output voltage level in the standby-released state, the current for charging the load connected to the NO node is changed from level e5 to e6 to e7 of the current-voltage characteristic 63 (FIG. 3B).

The charging of the load from the NO node by the current changing from level e5 to e6 to e7 in the second correction circuit 20 is clearly more rapid than the charging performed by the current changing from saturation current region e11 to saturation current region e12 in the conventional second correction circuit 220. In the case where it is sufficient to obtain, in the second correction circuit 20, a charging time which is about the same as that provided by the conventional second correction circuit 220, the current changing from level e5 to e6 to e7 can be reduced. It is not necessary to set many saturation region currents as is necessary in the second correction circuit 220, and therefore the shoot-through current flowing from the supply terminal to the ground terminal when the output voltage F (FIG. 3B) is provided can be reduced.

Accordingly, the first correction circuit 10 and the second correction circuit 20 can charge an output load thereof rapidly at the time the standby function is released, compared to the conventional first and second correction circuits 210 and 220. The first correction circuit 10 and the second correction circuit 20 also reduces the circuit operating current.

In this example, respective output voltages of the first correction circuit 10 and the second correction circuit 20 are determined by the current-voltage characteristics of the transistor sections 1 and 3 and the current-voltage characteristic of the resistor sections 2 and 4. Even if the characteristics of the transistor are dispersed by, for example, dispersion in ambient temperature, production parameters, and supply voltage, the dispersion in delay time of the delay circuit can be suppressed.

In this example, the Pch transistor 1b having a diode connection, the Pch transistor 1d, the Pch transistor 1d, the Pch transistor 1e, the Nch transistor 3b, the Nch transistor 3d and the Nch transistor 3e are used. Instead, a diode biased in a forward direction may be used.

Figure 4:
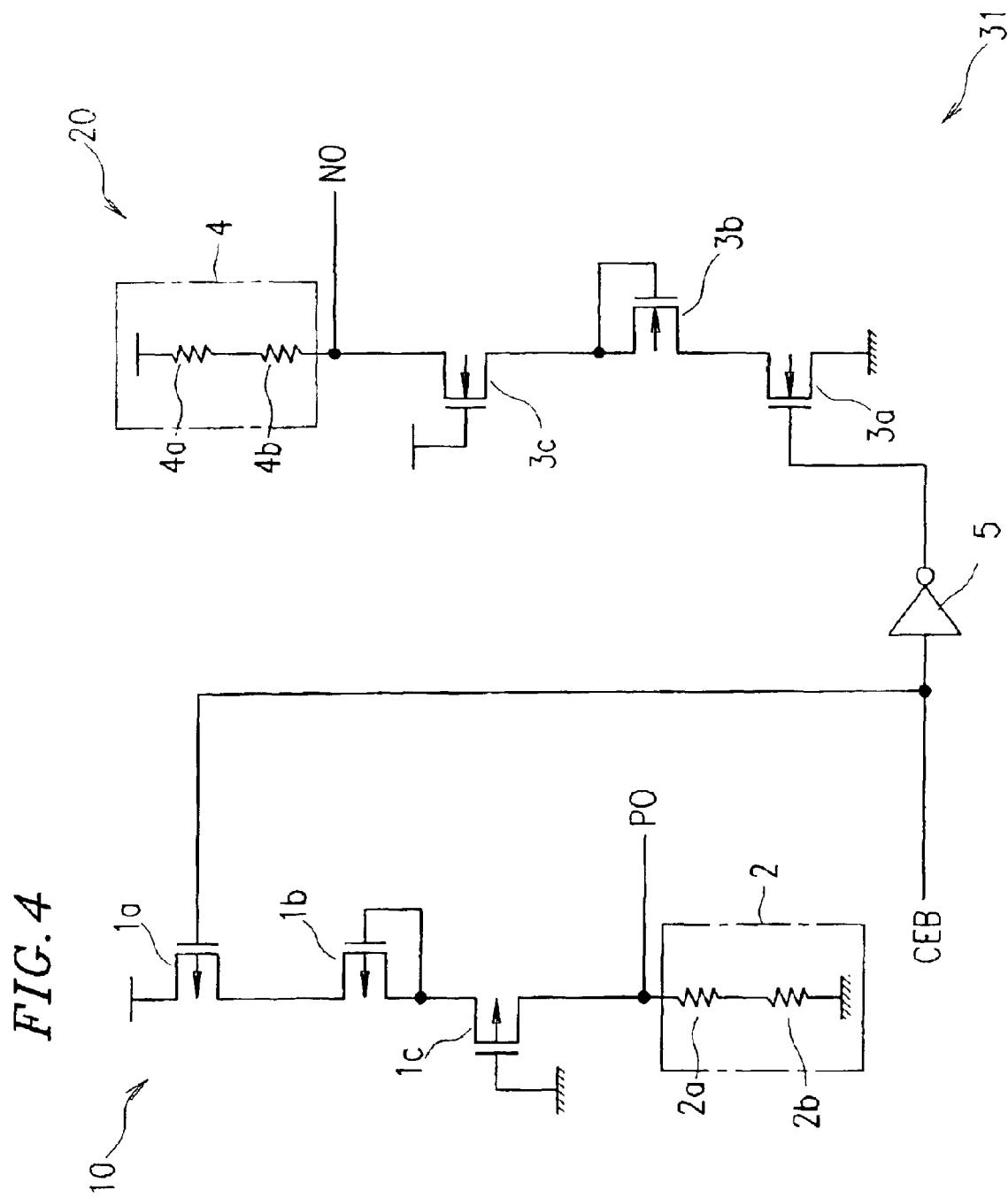
FIG. 4 is a circuit diagram illustrating a correction circuit system according to another example of the present invention.

FIG. 4 shows a circuit configuration of a correction circuit system 31 according to another example of the present invention. Here, an example in which high speed is not demanded when the voltage at the PO node or the NO node is changed to the output voltage level in the standby-released state will be described.

The correction circuit system 31 is a modification of the correction circuit system 30 shown in FIG. 2. The correction circuit system 31 does not include the Pch transistor 1d, the Pch transistor 1e, the Nch transistor 3d and the Nch transistor 3e which are constant voltage reduction elements included in the correction circuit system 30.

In the first correction circuit 10 shown in FIG. 4, a plurality of transistors 1a through 1c and a resistor section 2 including two resistors 2a and 2b are connected in series in this order between the supply terminal and the ground terminal. A connecting point (PO node) between the transistor 1c and the resistor section 2 outputs a voltage (control signal).

The correction circuit system 31 is not required to have high speed when the voltage at the PO node or the NO node is changed to the output voltage level in the standby-released state. Therefore, the first correction circuit 10 (FIG. 4) does not have a second transistor section 7 shown in FIG. 2. The correction circuit 10 includes the Pch transistor 1a acting as a switching element, the Pch transistor 1b having a gate electrode and a drain electrode connected to each other (diode connection) and acting as a constant voltage reducing element, and the Pch transistor 1a having a gate electrode connected to the ground voltage GND to act as an element for determining the characteristics of the control signal. The Pch transistors 1a, 1b and 1e are connected in series in this order from the supply terminal. The resistor section 2 shown in FIG. 4 has the same structure as that of the resistor section 2 shown in FIG. 2.

Similarly, the second correction circuit 20 does not have a second transistor section 9 shown in FIG. 2. The correction circuit 20 includes the Nch transistor 3a acting as a switching element, the Nch transistor 3b having a gate electrode and a drain electrode connected to each other (diode connection) and acting as a constant voltage reducing element, and the Nch transistor 3c having a gate electrode connected to the prescribed supply voltage VCC to act as an element for determining the characteristics of the control signal. The Nch transistors 3a, 3b and 3c are connected in series in this order from the supply terminal. The resistor section 4 shown in FIG. 4 has the same structure as that of the resistor section 4 shown in FIG. 2.

In the first correction circuit 10, the Pch transistor 1a shown in FIG. 4 may be omitted, in which case a standby-releasing signal CEB is input to the Pch transistor 1c. In the second correction circuit 20, the Nch transistor 3a shown in FIG. 4 may be omitted, in which case an inverted signal of the standby-releasing signal CEB is input to the Nch transistor 3c. The Pch transistor 1a and the Pch transistor 1b may be exchanged with each other. The Nch transistor 3a and the Nch transistor 3b may be exchanged with each other.

Figure 5:
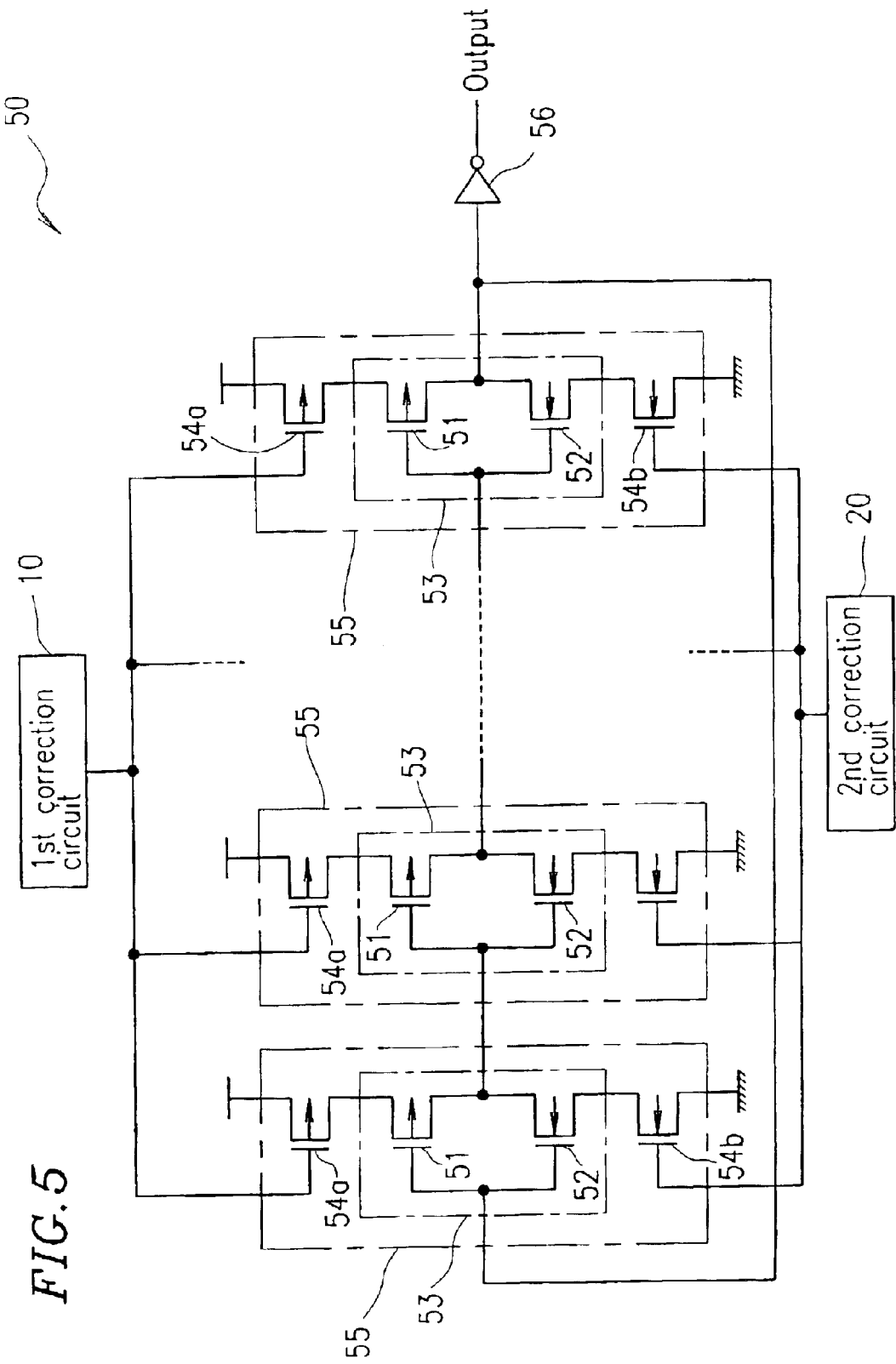
FIG. 5 is a circuit diagram illustrating a ring oscillator circuit according to still another example of the present invention.
Figure 6:
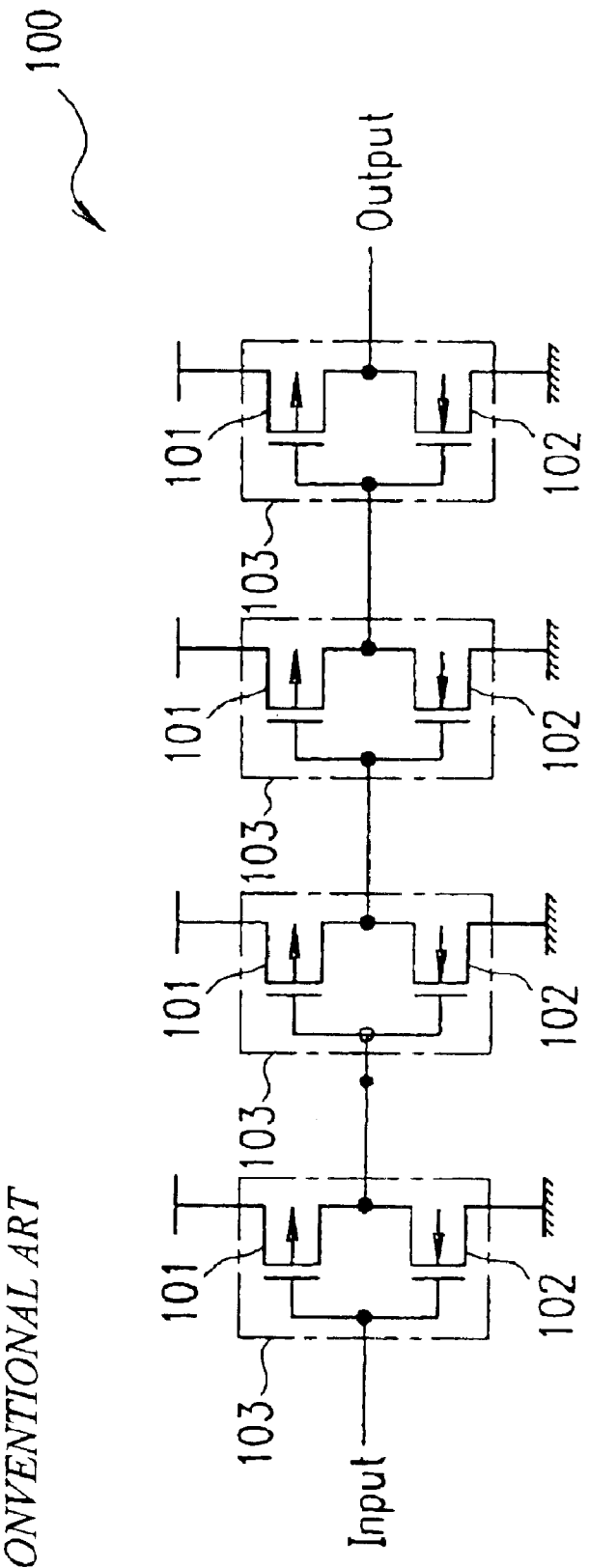
FIG. 6 is a circuit diagram illustrating a conventional delay circuit.
Figure 7:
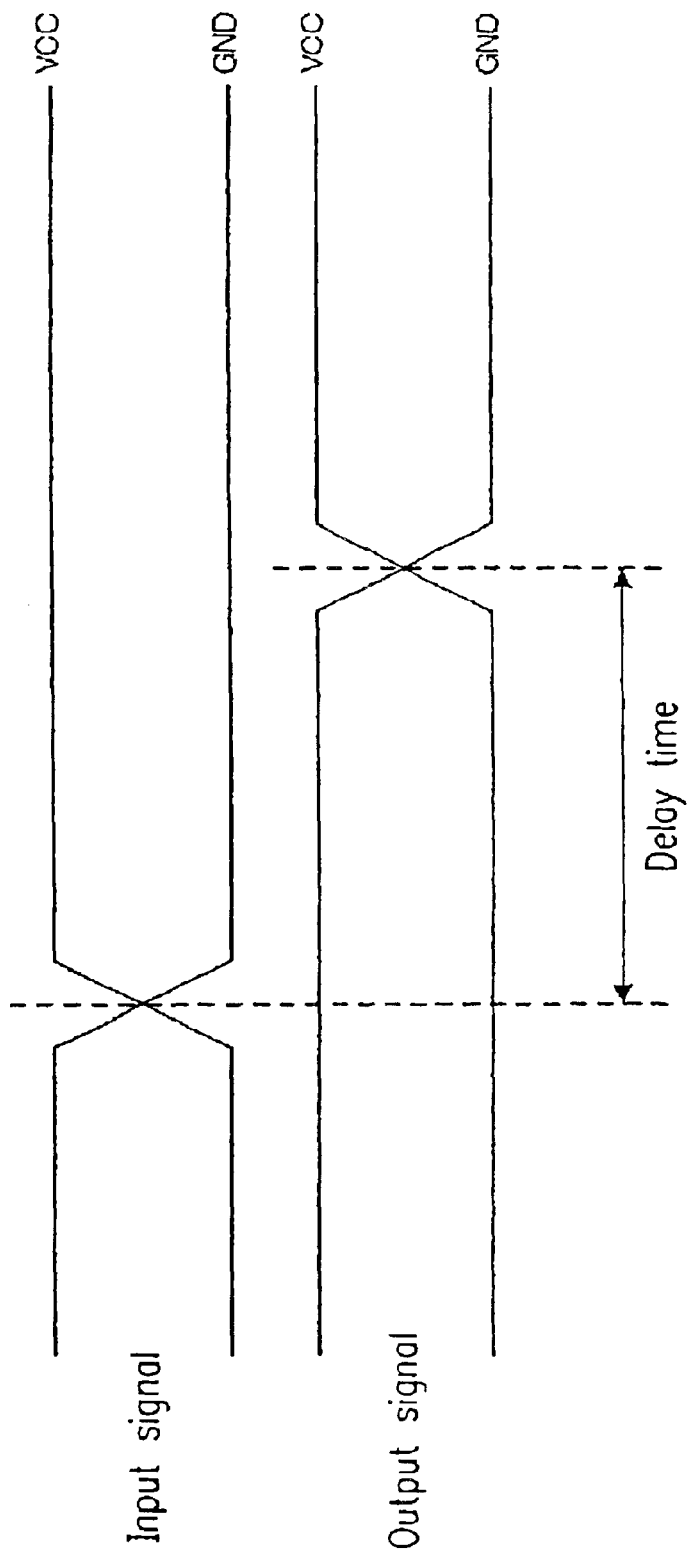
FIG. 7 is a timing diagram of the conventional delay circuit.

FIG. 5 shows a circuit configuration of a ring oscillator circuit 50 according to still another example of the present invention.

The ring oscillator circuit 50 includes an odd number of inverter circuits 55 which are connected in series, a first correction circuit 10, a second correction circuit 20, and an inverter circuit 56. Each inverter circuit 55 includes a logic inversion circuit 53 having a Pch transistor 51 and an Nch transistor 52 complementarily connected to each other as a pair, a Pch transistor 54a connected between the logic inversion circuit 53 and the supply terminal, and an Nch transistor 54b connected between the logic inversion circuit 53 and the ground terminal. An output section of the final-stage inverter circuit 55 is connected to an input section of the first-stage inverter circuit 55 in a feedback manner and also is connected to an input section of the inverter circuit 56.

The first correction circuit 10 and the second correction circuit 20 generate a control signal for correcting a characteristic change of at least one transistor included in the logic inversion circuit 53 (i.e. a characteristic change of the logic inversion circuit 53).

A gate electrode of the Pch transistor 54a of each inverter circuit 55 receives a voltage (control signal) generated in the first correction circuit 10. A gate electrode of the Nch transistor 54b of each inverter circuit 55 receives a voltage (control signal) generated in the second correction circuit 20. The first correction circuit 10 and the second correction circuit 20 have the above-described structures.

In the ring oscillator circuit 50, the first correction circuit 10 and the second correction circuit 20 are used such that a stable frequency output is realized regardless of the dispersion in voltage, temperature, production parameter or the like.

In the above-described embodiments, both a first correction circuit and a second correction circuit are used. A circuit according to the present invention may include only one of them.

As described above, the present invention provides a correction circuit for generating a control signal for correcting a change in the transistor characteristics caused by production conditions and physical conditions including supply voltage and temperature. In such a correction circuit, two types of resistors having different temperature dependency characteristics of the resistance value (for example, a resistor having a positive temperature dependency and a resistor having a negative temperature dependency) are connected to each other in series, and thus a resistor section having a desired temperature dependency is produced. Thus, the dispersion in delay time caused by the temperature dependency of the resistors can be controlled.

According to the present invention, a transistor for receiving a prescribed gate voltage, and a constant voltage reducing element including a transistor having a diode connection (or a diode biased in a forward direction), are connected in series. The transistor for receiving the prescribed gate voltage acts as an element for determining the characteristics of the output voltage of the correction circuit. The constant voltage reducing element is used to control the maximum possible voltage and the minimum possible voltage which are output from the correction circuit, so that the delay circuit is prevented from not operating due to the dispersion in production parameters of the resistors.

According to the present invention, a transistor for receiving a prescribed gate voltage and an additional constant voltage reducing element including a transistor having a diode connection (or a diode biased in a forward direction) are connected in parallel. While the output voltage from the correction circuit is changed to a desired voltage, the characteristics of the correction voltage can be determined by the additional constant voltage reducing element. Therefore, when the correction circuit has a standby function and is released from the standby state, the output voltage from the correction circuit can be changed to a desired voltage rapidly.

Accordingly, the present invention provides a stable delay time regardless of dispersion in supply voltage, temperature, production parameters or the like. Moreover, the dependency of the circuit on dispersion in supply voltage, temperature, production parameters or the like can be arbitrarily controlled to determine the delay time. In the case where a delay circuit is operated rapidly in a semiconductor integrated circuit having a standby function, the power consumption can be reduced. In the case where a boost circuit such as a charge pump or the like includes a ring oscillator circuit according to the present invention, the maximum operation current can be restricted.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A correction circuit for generating a control signal for correcting a characteristic change of a first transistor, comprising:

a control signal adjusting section including a constant voltage reduction element for determining either one of a maximum voltage and a minimum voltage of the control signal and a second transistor for determining a characteristic of the control signal, a gate electrode of the second transistor receiving a prescribed voltage; and a resistor section including two types of resistor elements having resistance values of different temperature dependency characteristics from each other, the resistor elements being connected in series, wherein:

the constant voltage reduction element, the second transistor, and the resistor section are connected in series between a supply terminal and a ground terminal, and the control signal is output from a connection point between the control signal adjusting section and the resistor section.

2. A correction circuit according to claim 1, further comprising a further constant voltage reduction element for determining one of the maximum voltage and the minimum voltage of the control signal, wherein the second transistor and the further constant voltage reduction element are connected in parallel.

3. A correction circuit according to claim 2, wherein the constant voltage reduction element and the further constant voltage reduction element each include one of a transistor having a diode connection and a diode biased in a forward direction.

4. A correction circuit according to claim 2, wherein:

the constant voltage reduction element is a first p-channel transistor having a diode connection, the second transistor is a second p-channel transistor and the prescribed voltage is a ground voltage, the further constant voltage reduction element includes a plurality of third p-channel transistors connected in series, the plurality of p-channel transistors each having a diode connection, one of two ends of the resistor section is connected to the ground terminal, and the control signal is output from a connection point between the other end of the resistor section and a parallel connection portion of the second transistor and the further constant voltage reduction element.

5. A correction circuit according to claim 4, further comprising a fourth p-channel transistor for blocking a DC current path between the supply terminal and the ground terminal, wherein the constant voltage reduction element, the second transistor, the resistor section and the fourth p-channel transistor are connected in series.

6. A correction circuit according to claim 2, wherein:

the constant voltage reduction element is a first n-channel transistor having a diode connection, the second transistor is a second n-channel transistor and the prescribed voltage is a supply voltage, the further constant voltage reduction element includes a plurality of third n-channel transistors connected in series, the plurality of n-channel transistors each having a diode connection, one of two ends of the resistor section is connected to the supply terminal, and the control signal is output from a connection point between the other end of the resistor section and a parallel connection portion of the second transistor and the further constant voltage reduction element.

7. A correction circuit according to claim 6, further comprising a fourth n-channel transistor for blocking a DC current path between the supply terminal and the ground terminal, wherein the constant voltage reduction element, the second transistor, the resistor section and the fourth n-channel transistor are connected in series.

8. A correction circuit according to claim 1, wherein the two types of resistor elements are a polycrystalline silicon resistor element and a diffusion resistor element formed of polycrystalline silicon containing impurities incorporated thereto.

9. A correction circuit according to claim 1, further comprising a switching element for blocking a DC current path between the supply terminal and the ground terminal, wherein the constant voltage reduction element, the second transistor, the resistor section, and the switching element are connected in series.

10. A correction circuit according to claim 1, wherein:
the constant voltage reduction element is a first p-channel transistor having a diode connection,
the second transistor is a second p-channel transistor, and the prescribed voltage is a ground voltage,
one of two ends of the resistor section is connected to the ground terminal, and
the control signal is output from a connection point between the control signal adjusting section and the other end of the resistor section.

11. A correction circuit according to claim 10, further comprising a third p-channel transistor for blocking a DC current path between the supply terminal and the ground terminal, wherein the constant voltage reduction element, the second transistor, the resistor section and the third p-channel transistor are connected in series.

12. A correction circuit according to claim 1, wherein:
the constant voltage reduction element is a first n-channel transistor having a diode connection,
the second transistor is a second n-channel transistor, and the prescribed voltage is a supply voltage,
one of two ends of the resistor section is connected to the supply terminal, and
the control signal is output from a connection point between the control signal adjusting section and the other end of the resistor section.

13. A correction circuit according to claim 12, further comprising a third n-channel transistor for blocking a DC current path between the supply terminal and the ground terminal, wherein the constant voltage reduction element, the second transistor, the resistor section and the third n-channel transistor are connected in series.

14. A delay circuit, comprising:
a logic inversion circuit;
a correction circuit for generating a control signal for correcting a characteristic change of the logic inversion circuit; and a first transistor connected between the logic inversion circuit and a supply terminal, wherein the correction circuit includes:

a control signal adjusting section including a constant voltage reduction element for determining either one of a maximum voltage and a minimum voltage of the control signal and a second transistor for determining a characteristic of the control signal, a gate electrode of the second transistor receiving a prescribed voltage; and a resistor section including two types of resistor elements having resistance values of different temperature dependency characteristics from each other, the resistor elements being connected in series, wherein:

the constant voltage reduction element, the second transistor, and the resistor section are connected in series between the first transistor and a ground terminal, and the control signal is output from a connection point between the control signal adjusting section and the resistor section and input to a gate electrode of the first transistor.

15. A delay circuit, comprising:

a first logic inversion circuit;

a second logic inversion circuit connected to the first logic inversion circuit in series;

a first correction circuit for generating a first control signal for correcting a characteristic change in the first logic inversion circuit;

a second correction circuit for generating a second control signal for correcting a characteristic change in the second logic inversion circuit;

a p-channel transistor connected between the first logic inversion circuit and a supply terminal; and an n-channel transistor connected between the second logic inversion circuit and a ground terminal, wherein:

the first correction circuit includes:

a first control signal adjusting section including a first constant voltage reduction element for determining a maximum voltage of the first control signal and a first transistor for determining a characteristic of the first control signal, a gate electrode of the first transistor receiving a first prescribed voltage; and a first resistor section including two types of resistor elements having resistance values of different temperature dependency characteristics from each other, the resistor elements being connected in series, wherein:

the first constant voltage reduction element, the first transistor, and the first resistor section are connected in series between the supply terminal and the ground terminal, and the first control signal is output from a connection point between the first control signal adjusting section and the first resistor section and input to a gate electrode of the p-channel transistor, the second correction circuit includes:

a second control signal adjusting section including a second constant voltage reduction element for determining a minimum voltage of the second control signal and a second transistor for determining a characteristic of the second control signal, a gate electrode of the second transistor receiving a second prescribed voltage; and a second resistor section including two types of resistor elements having resistance values of different temperature dependency characteristics from each other, the resistor elements being connected in series, wherein:

the second constant voltage reduction element, the second transistor, and the second resistor section are connected in series between the supply terminal and the ground terminal, and the second control signal is output from a connection point between the second control signal adjusting section and the second resistor section and input to a gate electrode of the n-channel transistor.

16. A ring oscillator circuit, comprising:

an odd number of logic inversion circuits connected in series;

a first correction circuit for generating a first control signal for correcting a characteristic change in the odd number of logic inversion circuits;

a second correction circuit for generating a second control signal for correcting a characteristic change in the odd number of logic inversion circuits;

a plurality of p-channel transistors each connected between a corresponding one of the odd number of logic inversion circuits and a supply terminal; and a plurality of n-channel transistors each connected between a corresponding one of the odd number of logic inversion circuits and a ground terminal, wherein:

among the odd number of logic inversion circuits, a first-stage logic inversion circuit and a final-stage logic inversion circuit are connected in series in a feedback manner, the first correction circuit includes:

a first control signal adjusting section including a first constant voltage reduction element for determining a maximum voltage of the first control signal and a first transistor for determining a characteristic of the first control signal, a gate electrode of the first transistor receiving a first prescribed voltage; and a first resistor section including two types of resistor elements having resistance values of different temperature dependency characteristics from each other, the resistor elements being connected in series, wherein:

the first constant voltage reduction element, the first transistor, and the first resistor section are connected in series between the supply terminal and the ground terminal, and the first control signal is output from a connection point between the first control signal adjusting section and the first resistor section and input to a gate electrode of each of the p-channel transistors, the second correction circuit includes:

a second control signal adjusting section including a second constant voltage reduction element for determining a minimum voltage of the second control signal and a second transistor for determining a characteristic of the second control signal, a gate electrode of the second transistor receiving a second prescribed voltage; and a second resistor section including two types of resistor elements having resistance values of different temperature dependency characteristics from each other, the resistor elements being connected in series, wherein:

the second constant voltage reduction element, the second transistor, and the second resistor section are connected in series between the supply terminal and the ground terminal, and the second control signal is output from a connection point between the second control signal adjusting section and the second resistor section and input to a gate electrode of each of the plurality of n-channel transistors.

17. A method for generating a control signal for correcting a characteristic change of a first transistor, comprising:

determining either one of a maximum voltage and a minimum voltage of the control signal from a control signal adjusting section including a constant voltage reduction element;

determining a characteristic of the control signal from a second transistor, a gate electrode of the second transistor receiving a prescribed voltage;

connecting in series resistor elements in a resistor section including two types of the resistor elements having resistance values of different temperature dependency characteristics from each other;

connecting in series, between a supply terminal and a ground terminal, the constant voltage reduction element, the second transistor, and the resistor section; and outputting, from a connection point between the control signal adjusting section and the resistor section, the control signal.

18. A method for providing a delay circuit, comprising:

providing a logic inversion circuit;

generating, from a correction circuit, a control signal for correcting a characteristic change of the logic inversion circuit;

connecting a first transistor between the logic inversion circuit and a supply terminal, determining either one of a maximum voltage and a minimum voltage of the control signal from a control signal adjusting section including a constant voltage reduction element;

determining a characteristic of the control signal from a second transistor, a gate electrode of the second transistor receiving a prescribed voltage;

connecting in series resistor elements in a resistor section including two types of the resistor elements having resistance values of different temperature dependency characteristics from each other;

connecting in series, between a supply terminal and a ground terminal, the constant voltage reduction element, the second transistor, and the resistor section;

outputting, from a connection point between the control signal adjusting section and the resistor section, the control signal; and inputting the control signal to a gate electrode of the first transistor.

19. A method for providing a delay circuit, comprising:

providing a first logic inversion circuit;

connecting in series a second logic inversion circuit to the first logic inversion circuit;

generating from a first correction circuit a first control signal for correcting a characteristic change in the first logic inversion circuit;

generating from a second correction circuit a second control signal for correcting a characteristic change in the second logic inversion circuit;

connecting a p-channel transistor between the first logic inversion circuit and a supply terminal;

connecting an n-channel transistor between the second logic inversion circuit and a ground terminal, determining a maximum voltage of the first control signal from a first control signal adjusting section including a first constant voltage reduction element; determining a characteristic of the first control signal from a first transistor, a gate electrode of the first transistor receiving a first prescribed voltage;

connecting in series resistor elements in a first resistor section including two types of the resistor elements having resistance values of different temperature dependency characteristics from each other;

connecting in series the first constant voltage reduction element, the first transistor, and the first resistor section between the supply terminal and the ground terminal;

outputting the first control signal from a connection point between the first control signal adjusting section and the first resistor section;

inputting the first control signal to a gate electrode of the p-channel transistor;

determining a minimum voltage of the second control signal from a second control signal adjusting section including a second constant voltage reduction element;

determining a characteristic of the second control signal from a second transistor, a gate electrode of the second transistor receiving a second prescribed voltage;

connecting in series resistor elements in a second resistor section including two types of the resistor elements having resistance values of different temperature dependency characteristics from each other;

connecting in series the second constant voltage reduction element, the second transistor, and the second resistor section between the supply terminal and the ground terminal;

outputting the second control signal from a connection point between the second control signal adjusting section and the second resistor section; and inputting the second control signal to a gate electrode of the n-channel transistor.

20. A method for providing a ring oscillator circuit, comprising:

providing an odd number of logic inversion circuits connected in series;

generating from a first correction circuit a first control signal for correcting a characteristic change in the odd number of logic inversion circuits;

generating from a second correction circuit a second control signal for correcting a characteristic change in the odd number of logic inversion circuits;

connecting a plurality of p-channel transistors between a corresponding one of the odd number of logic inversion circuits and a supply terminal;

connecting a plurality of n-channel transistors between a corresponding one of the odd number of logic inversion circuits and a ground terminal;

connecting in series in a feedback manner, among the odd number of logic inversion circuits, a first-stage logic inversion circuit and a final-stage logic inversion circuit;

determining a maximum voltage of the first control signal from a first control signal adjusting section including a first constant voltage reduction element;

determining a characteristic of the first control signal from a first transistor, a gate electrode of the first transistor receiving a first prescribed voltage;

connecting in series resistor elements in a first resistor section including two types of the resistor elements having resistance values of different temperature dependency characteristics from each other;

connecting in series the first constant voltage reduction element, the first transistor, and the first resistor section between the supply terminal and the ground terminal;

outputting the first control signal from a connection point between the first control signal adjusting section and the first resistor section;

inputting the first control signal to a gate electrode of each of the p-channel transistors, determining a minimum voltage of the second control signal from a second control signal adjusting section including a second constant voltage reduction element;

determining a characteristic of the second control signal from a second transistor, a gate electrode of the second transistor receiving a second prescribed voltage;

connecting in series resistor elements in a second resistor section including two types of the resistor elements having resistance values of different temperature dependency characteristics from each other;

connecting in series the second constant voltage reduction element, the second transistor, and the second resistor section between the supply terminal and the ground terminal;

outputting the second control signal from a connection point between the second control signal adjusting section and the second resistor section; and inputting the second control signal to a gate electrode of each of the plurality of n-channel transistors.

* * * * *